United States Patent
Uchida et al.

(10) Patent No.: US 10,830,838 B2
(45) Date of Patent: Nov. 10, 2020

(54) MAGNETIC SENSOR

(71) Applicant: TDK CORPORATION, Tokyo (JP)

(72) Inventors: Keisuke Uchida, Tokyo (JP); Kenzo Makino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 251 days.

(21) Appl. No.: 16/028,632

(22) Filed: Jul. 6, 2018

(65) Prior Publication Data
US 2019/0056459 A1 Feb. 21, 2019

(30) Foreign Application Priority Data
Aug. 18, 2017 (JP) ................................. 2017-157745

(51) Int. Cl.
*G01R 33/05* (2006.01)
(52) U.S. Cl.
CPC .................................... *G01R 33/05* (2013.01)
(58) Field of Classification Search
CPC ...... G01R 33/05; G01R 33/093; G01R 33/09; G01R 33/091; G01R 33/096; G01R 33/098; G01R 33/02; H01L 43/08
See application file for complete search history.

(56) References Cited

U.S. PATENT DOCUMENTS

| | | | | |
|---|---|---|---|---|
| 2004/0004261 | A1* | 1/2004 | Takahashi | G11B 5/3903 257/414 |
| 2005/0018476 | A1* | 1/2005 | Kamijima | H01L 43/08 365/158 |
| 2005/0099865 | A1* | 5/2005 | Hatate | G11C 11/1675 365/202 |
| 2009/0309590 | A1* | 12/2009 | Kataoka | G01R 33/0011 324/244 |
| 2017/0276739 | A1* | 9/2017 | Obana | G01R 33/0011 |

FOREIGN PATENT DOCUMENTS

JP 2015-203647 A 11/2015

* cited by examiner

*Primary Examiner* — Patrick Assouad
*Assistant Examiner* — Haidong Zhang
(74) *Attorney, Agent, or Firm* — Oliff PLC

(57) ABSTRACT

A magnetic sensor includes a magnetic field conversion unit, a magnetic field detection unit, and a magnetic film. The magnetic field conversion unit includes a yoke that receives an input magnetic field and generates an output magnetic field. The input magnetic field contains an input magnetic field component in a direction parallel to Z direction. The output magnetic field contains an output magnetic field component in a direction parallel to X direction. The magnetic field detection unit includes a magnetic detection element that receives the output magnetic field and generates a detection value corresponding to the output magnetic field component. The magnetic film absorbs part of magnetic flux resulting from a noise magnetic field, which is a magnetic field in a direction to which the magnetic detection element has sensitivity and which is other than the output magnetic field component.

11 Claims, 15 Drawing Sheets

MAGNETIC SENSOR

BACKGROUND OF THE INVENTION

1. Field of the Invention

The present invention relates to a magnetic sensor capable of detecting, through the use of a magnetic detection element, a magnetic field in a direction other than the direction to which the magnetic detection element has sensitivity.

2. Description of the Related Art

Nowadays, some mobile telecommunication devices such as mobile phones may be configured with geomagnetic sensors. It is required of the geomagnetic sensors intended for such use to be small in size and capable of detecting three-dimensional directions of an external magnetic field. Such geomagnetic sensors are implemented using magnetic sensors, for example. Magnetic sensors provided with a plurality of magnetic detection elements on a substrate are known. The magnetic detection elements may be magnetoresistive elements, for example.

In many cases, the magnetic detection elements provided on a substrate are configured to detect a magnetic field in a direction parallel to the plane of the substrate. To implement a geomagnetic sensor using a magnetic sensor, the magnetic sensor needs to be capable of detecting a magnetic field in a direction perpendicular to the plane of the substrate.

JP 2015-203647A describes a magnetic sensor capable of detecting a magnetic field in a direction perpendicular to the plane of a substrate by using a magnetoresistive element configured to detect a magnetic field in a direction parallel to the plane of the substrate. The magnetic sensor includes a soft magnetic material for converting a vertical magnetic field component perpendicular to the plane of the substrate into a horizontal magnetic field component parallel to the plane of the substrate, and supplying the horizontal magnetic field component to the magnetoresistive element.

A magnetic sensor including a magnetic detection element such as a magnetoresistive element and a soft magnetic material for converting the vertical magnetic field component into the horizontal magnetic field component, like the magnetic sensor described in JP 2015-203647A, has the following problem. If the magnetic sensor is subjected not only to the horizontal magnetic field component obtained by conversion from the vertical magnetic field component by the soft magnetic material but also to a magnetic field in a direction parallel to the plane of the substrate, the magnetic detection element in the magnetic sensor detects such a magnetic field as well as the foregoing horizontal magnetic field component. As a result, the magnetic field in the direction parallel to the plane of the substrate, which is other than the horizontal magnetic field component, acts as a noise magnetic field on the magnetic sensor, so that the detection value provided by the magnetic detection element contains a noise component resulting from the noise magnetic field.

SUMMARY OF THE INVENTION

It is an object of the present invention to provide a magnetic sensor configured to convert an input magnetic field component in a predetermined direction into an output magnetic field component in a direction to which a magnetic detection element has sensitivity and to apply the output magnetic field component to the magnetic detection element, the magnetic sensor being capable of inhibiting application of a noise magnetic field, which is a magnetic field in the direction to which the magnetic detection element has sensitivity and which is other than the output magnetic field component, to the magnetic detection element.

A magnetic sensor of each of a first and a second aspect of the present invention includes a magnetic field conversion unit, a magnetic field detection unit, and a magnetic film formed of a soft magnetic material. The magnetic field conversion unit includes at least one yoke formed of a soft magnetic material. The at least one yoke is configured to receive an input magnetic field and generate an output magnetic field, the input magnetic field containing an input magnetic field component in a direction parallel to a first virtual straight line. The output magnetic field contains an output magnetic field component in a direction parallel to a second virtual straight line intersecting the first virtual straight line. The output magnetic field component varies depending on the input magnetic field component. The magnetic field detection unit includes at least one magnetic detection element. The at least one magnetic detection element is configured to receive the output magnetic field and generate a detection value corresponding to the output magnetic field component. The at least one yoke has a first end and a second end opposite to each other in the direction parallel to the first virtual straight line. The first end is located closer to the at least one magnetic detection element than is the second end. The at least one magnetic detection element has a third end and a fourth end opposite to each other in the direction parallel to the first virtual straight line. The fourth end is located closer to the at least one yoke than is the third end.

In the magnetic sensor of the first aspect of the present invention, assuming that there are a first virtual plane including the first end, intersecting the first virtual straight line and being parallel to the second virtual straight line, and a second virtual plane including the fourth end and being parallel to the first virtual plane, the magnetic film is located within a spatial range extending from the first virtual plane to the second virtual plane. The at least one yoke has a width, the width being a dimension in the direction parallel to the second virtual straight line. The magnetic film has a thickness and a width, the thickness being a dimension in the direction parallel to the first virtual straight line, the width being a dimension in the direction parallel to the second virtual straight line. The thickness of the magnetic film is smaller than the width of the at least one yoke. The width of the magnetic film is greater than the width of the at least one yoke.

In the magnetic sensor of the first aspect of the present invention, the magnetic film may be in contact with the first end of the at least one yoke. Alternatively, the magnetic sensor of the first aspect of the present invention may further include a nonmagnetic film formed of a nonmagnetic material and separating the at least one yoke from the magnetic film.

In the magnetic sensor of the second aspect of the present invention, assuming that there are a first virtual plane including the first end, intersecting the first virtual straight line and being parallel to the second virtual straight line, a second virtual plane including the fourth end and being parallel to the first virtual plane, and a third virtual plane including the third end and being parallel to the first virtual plane, the magnetic film is located on a side of the third virtual plane opposite from the first virtual plane. The at least one yoke has a width, the width being a dimension in the direction parallel to the second virtual straight line. The magnetic film has a thickness and a width, the thickness being a dimension in the direction parallel to the first virtual straight line, the width being a dimension in the direction parallel to the second virtual straight line. The thickness of the magnetic film is smaller than the width of the at least one yoke. The width of the magnetic film is greater than the width of the at least one yoke.

In the magnetic sensor of the second aspect of the present invention, a distance between the magnetic film and the third virtual plane may be smaller than or equal to a distance between the first virtual plane and the second virtual plane.

In the magnetic sensor of each of the first and the second aspect of the present invention, the second virtual straight line and the first virtual plane may be orthogonal to the first virtual straight line. The thickness of the magnetic film may be smaller than or equal to one-half the width of the at least one yoke.

The magnetic sensor of each of the first and second aspects of the present invention enables the magnetic film to absorb part of a magnetic flux resulting from a noise magnetic field, thereby inhibiting application of the noise magnetic field to the magnetic detection element.

Other and further objects, features and advantages of the present invention will appear more fully from the following description.

DETAILED DESCRIPTION OF THE PREFERRED EMBODIMENTS

First Embodiment

Figure 10:
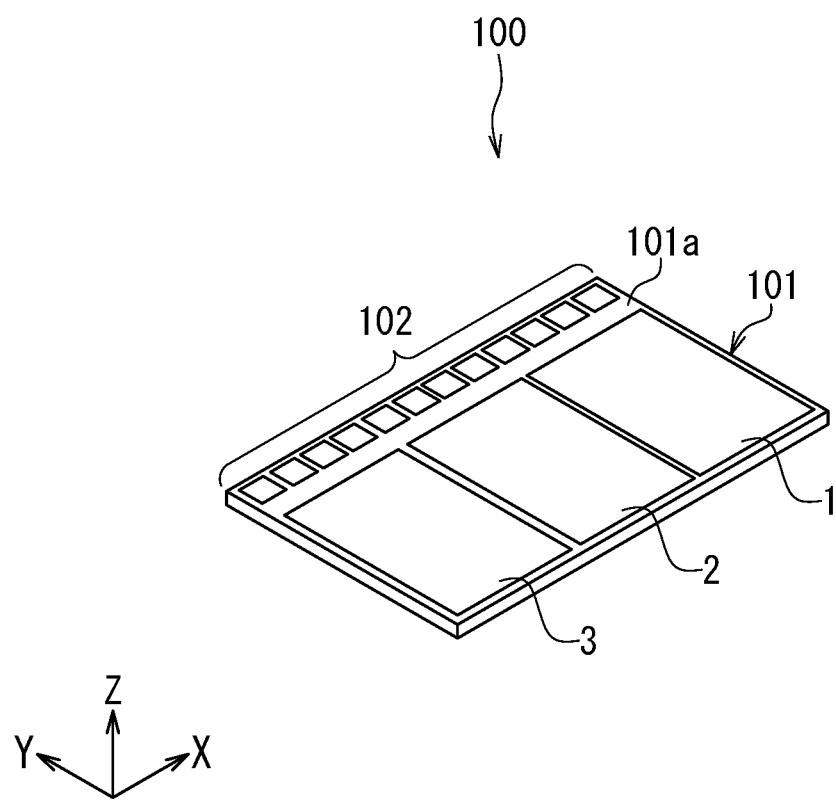
FIG. 10 is a perspective view of a magnetic sensor unit including the magnetic sensor according to the first embodiment of the invention.

Preferred embodiments of the present invention will now be described in detail with reference to the drawings. First, reference is made to FIG. 10 to describe the configuration of a magnetic sensor unit including a magnetic sensor according to a first embodiment of the invention. FIG. 10 is a perspective view of the magnetic sensor unit 100. The magnetic sensor unit 100 includes: a substrate 101 having a top surface 101a; a magnetic sensor 1 according to the first embodiment; and two magnetic sensors 2 and 3 other than the magnetic sensor 1. The magnetic sensors 1 to 3 are aligned on the top surface 101a of the substrate 101.

Now, we define X, Y and Z directions as shown in FIG. 10. The X, Y and Z directions are orthogonal to one another. In the present embodiment, the X direction is from the magnetic sensor 3 to the magnetic sensor 1, and the Z direction is a direction perpendicular to the top surface 101a of the substrate 101. Further, −X, −Y, and −Z directions refer to directions that are opposite to the X, Y, and Z directions, respectively. As used herein, the term "above" refers to positions located forward of a reference position in the Z direction, and "below" refers to positions located on a side of the reference position opposite to "above".

The magnetic sensor 1 according to the present embodiment is configured to detect a magnetic field in a direction parallel to the Z direction. The magnetic sensor 2 is configured to detect a magnetic field in a direction parallel to the Y direction. The magnetic sensor 3 is configured to detect a magnetic field in a direction parallel to the X direction.

The magnetic sensor unit 100 further includes a plurality of electrode pads 102 aligned in the X direction on the top surface 101a of the substrate 101. The electrode pads 102 are electrically connected to the magnetic sensors 1 to 3.

Figure 1:
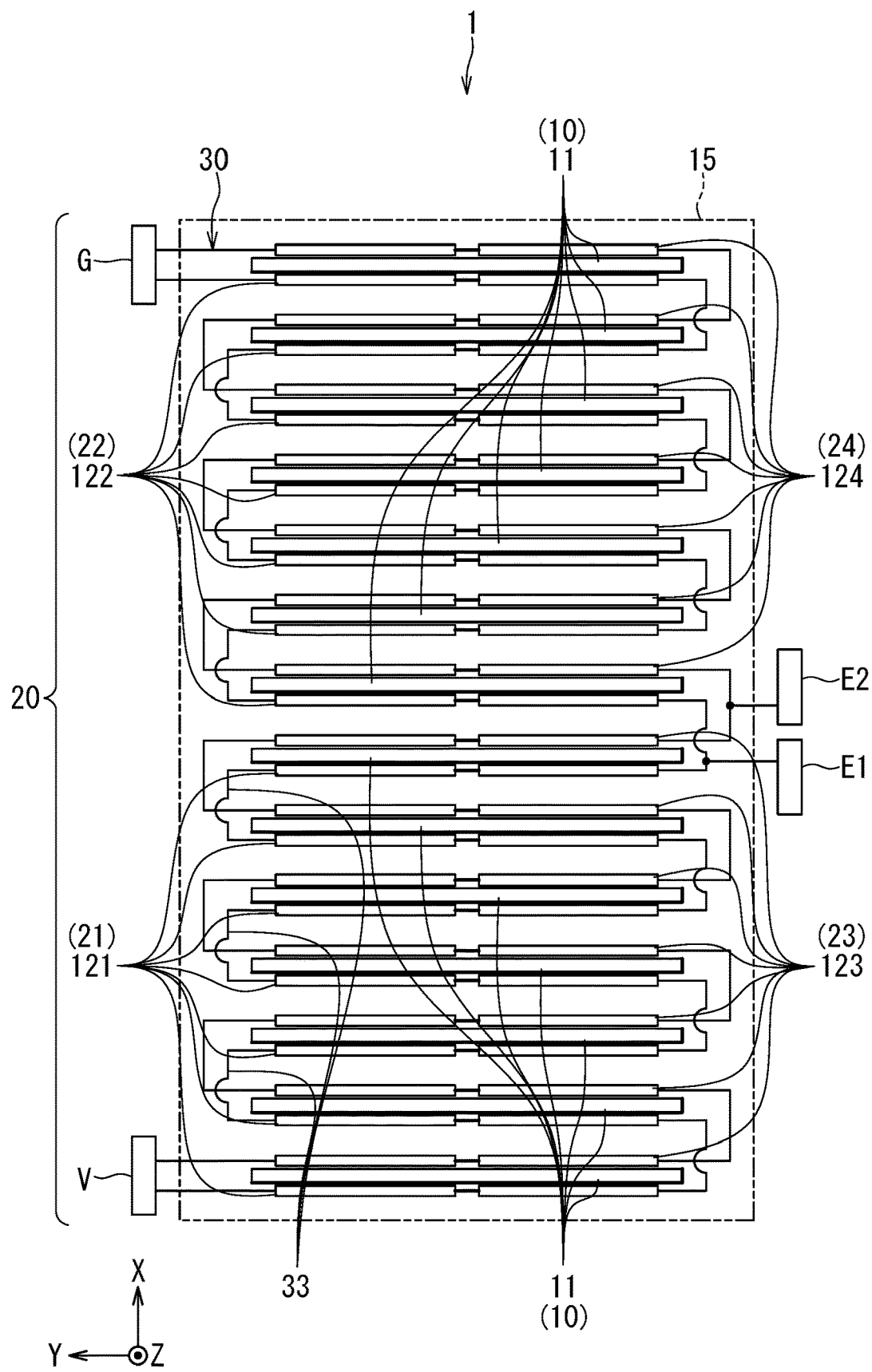
FIG. 1 is an explanatory diagram schematically illustrating the configuration of a magnetic sensor according to a first embodiment of the invention.
Figure 2:
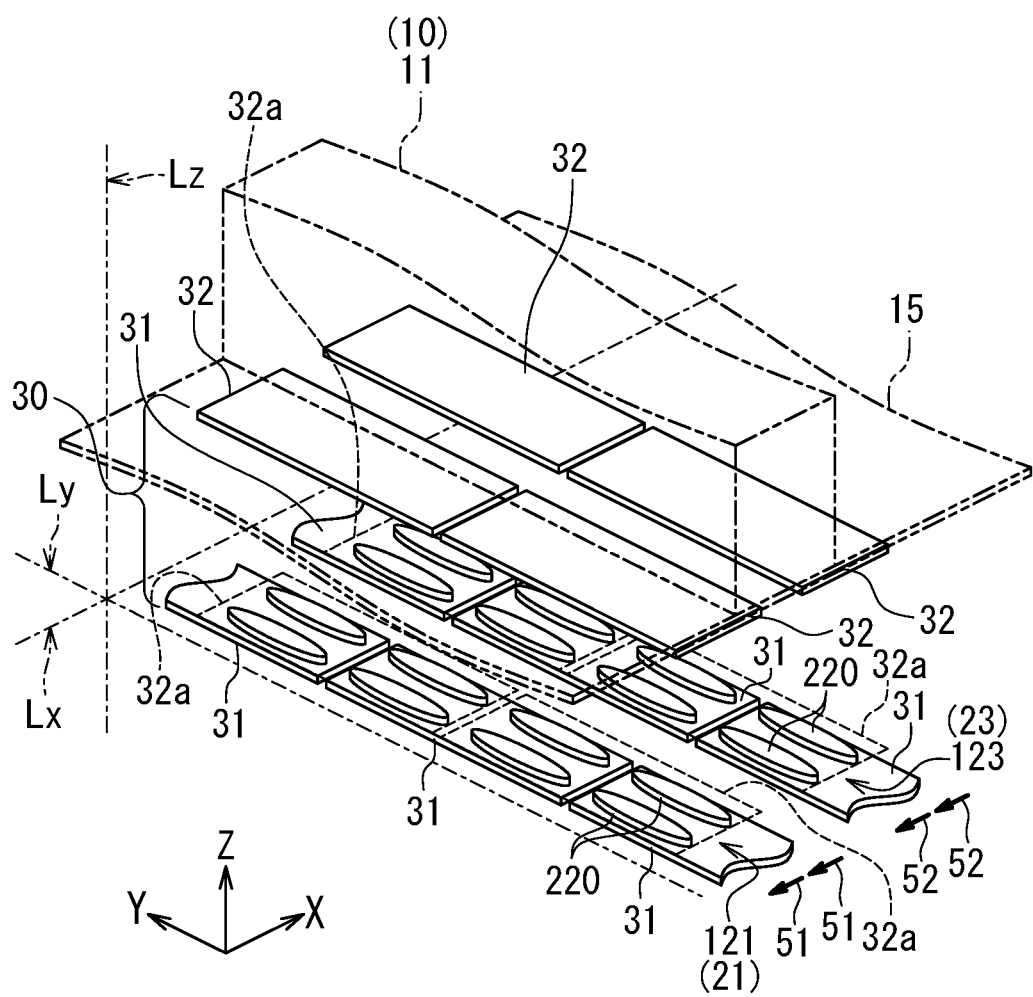
FIG. 2 is an exploded perspective view of part of the magnetic sensor according to the first embodiment of the invention.
Figure 3:
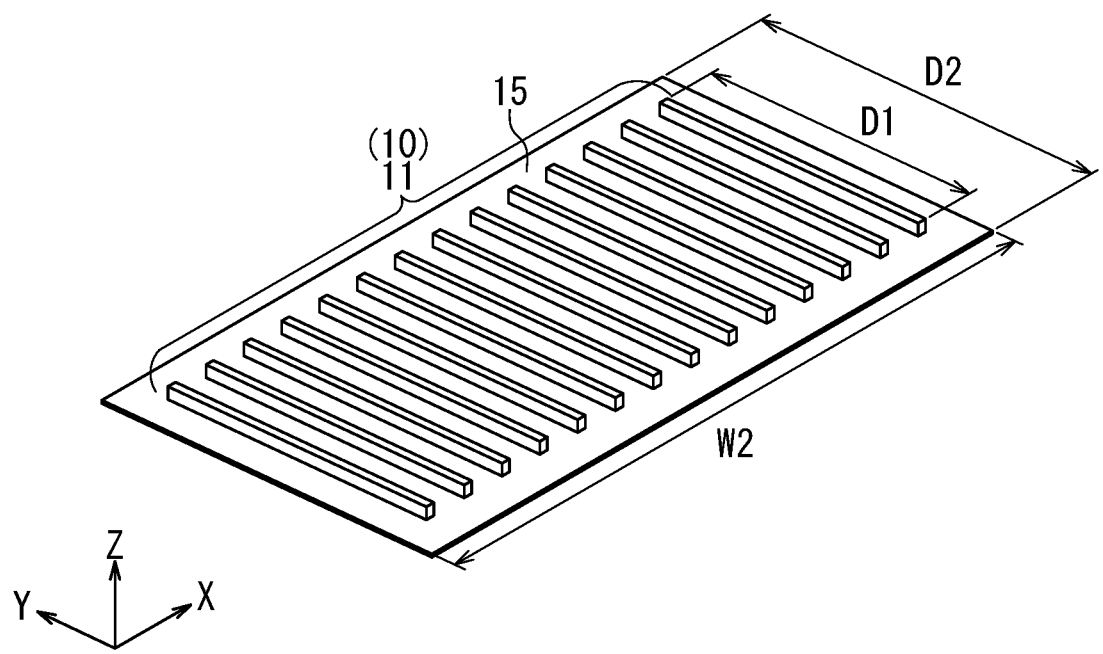
FIG. 3 is a perspective view of a magnetic field conversion unit and a magnetic film of the first embodiment of the invention.
Figure 4:
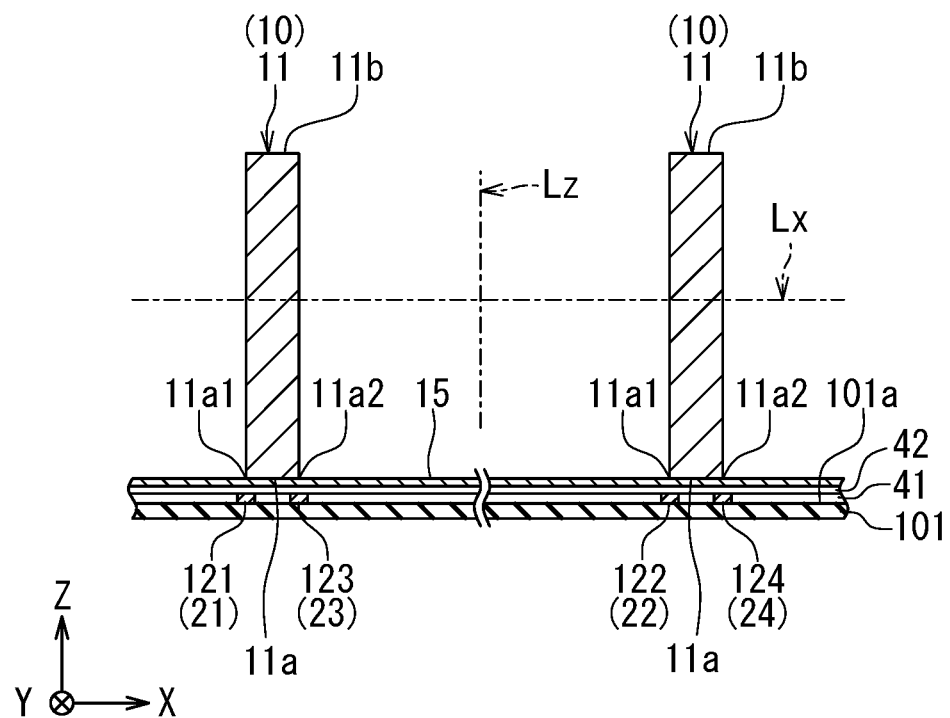
FIG. 4 is a cross-sectional view showing a cross section of part of the magnetic sensor according to the first embodiment of the invention, the cross section being perpendicular to Y direction.

Now, the configuration of the magnetic sensor 1 according to the present embodiment will be described in detail with reference to FIG. 1 to FIG. 4. FIG. 1 is an explanatory diagram schematically illustrating the configuration of the magnetic sensor 1. FIG. 2 is an exploded perspective view of part of the magnetic sensor 1. FIG. 3 is a perspective view of a magnetic field conversion unit and a magnetic film. FIG. 4 is a cross-sectional view showing a cross section of part of the magnetic sensor 1, the cross section being perpendicular to the Y direction.

Now, we define a first virtual straight line Lz, a second virtual straight line Lx, and a third virtual straight line Ly as follows. As shown in FIG. 2 and FIG. 4, the first virtual straight line Lz is a straight line parallel to the Z direction. The second virtual straight line Lx is a straight line intersecting the first virtual straight line Lz. In the present embodiment, as shown in FIG. 2 and FIG. 4, the second virtual straight line Lx is orthogonal to the first virtual straight line Lz and parallel to the X direction. As shown in FIG. 2, the third virtual straight line Ly is a straight line parallel to the Y direction.

Directions parallel to the first virtual straight line Lz include the Z direction and the −Z direction. Directions parallel to the second virtual straight line Lx include the X direction and the −X direction. Directions parallel to the third virtual straight line Ly include the Y direction and the −Y direction.

As shown in FIG. 1 and FIG. 2, the magnetic sensor 1 includes a magnetic field conversion unit 10 and a magnetic field detection unit 20. The magnetic field conversion unit 10 includes at least one yoke formed of a soft magnetic material. The at least one yoke is configured to receive an input magnetic field and generate an output magnetic field. The input magnetic field contains an input magnetic field component in a direction parallel to the first virtual straight line Lz. The magnetic field detection unit 20 is configured to receive the output magnetic field and generate an output signal corresponding to the input magnetic field component. The output magnetic field contains an output magnetic field component in a direction parallel to the second virtual straight line Lx. The output magnetic field component varies depending on the input magnetic field component.

In the present embodiment, as shown in FIG. 3, the magnetic field conversion unit 10 includes a plurality of yokes 11, as the at least one yoke. The plurality of yokes 11 are aligned in the X direction. Each yoke 11 is in the shape of a rectangular solid that is long in the Y direction. The plurality of yokes 11 are of identical shape.

As shown in FIG. 1, the magnetic field detection unit 20 includes a first resistor section 21, a second resistor section 22, a third resistor section 23 and a fourth resistor section 24 each of which has a resistance value that varies depending on the input magnetic field component. Each of the first to fourth resistor sections 21 to 24 includes at least one magnetic detection element. Since the first to fourth resistor sections 21 and 24 are part of the magnetic field detection unit 20, the magnetic field detection unit 20 can be said to include at least one magnetic detection element. The at least one magnetic detection element is configured to receive the output magnetic field and generate a detection value corresponding to the output magnetic field component.

FIG. 2 partially shows the first and third resistor sections 21 and 23. In the present embodiment, as shown in FIG. 2, each of the first and third resistor sections 21 and 23 includes a plurality of magnetic detection elements 220 as the at least one magnetic detection element. Although not illustrated, each of the second and fourth resistor sections 22 and 24 also includes a plurality of magnetic detection elements 220 as the at least one magnetic detection element.

In the present embodiment, each of the first to fourth resistor sections 21 to 24 includes a plurality of magnetic detection element trains. Each of the magnetic detection element trains includes a plurality of magnetic detection elements 220 aligned in the Y direction. The magnetic detection element trains in the first resistor section 21 will be denoted by the reference numeral 121. The magnetic detection element trains in the second resistor section 22 will be denoted by the reference numeral 122. The magnetic detection element trains in the third resistor section 23 will be denoted by the reference numeral 123. The magnetic detection element trains in the fourth resistor section 24 will be denoted by the reference numeral 124. In FIG. 1, each of the magnetic detection element trains 121 to 124 is shown as divided into two in the Y direction.

In the present embodiment, as shown in FIG. 1, the magnetic detection element trains 121 and 123 are alternately arranged in the order of the magnetic detection element train 121 and the magnetic detection element train 123 along the X direction. The magnetic detection element trains 122 and 124 are alternately arranged in the order of the magnetic detection element train 122 and the magnetic detection element train 124 along the X direction. A description will be given later as to how the plurality of magnetic detection elements 220 are arranged in the magnetic detection element trains 121 to 124.

The magnetic sensor 1 further includes a substrate for holding the magnetic detection elements 220, and a wiring section 30 for establishing electrical connection between the magnetic detection elements 220. In the present embodiment, as shown in FIG. 4, the substrate 101 shown in FIG. 10 also serves as the aforementioned substrate of the magnetic sensor 1. In FIG. 1 the wiring section 30 is depicted in a simplified manner. FIG. 4 omits the illustration of the wiring section 30.

As shown in FIG. 2, the wiring section 30 includes a plurality of lower electrodes 31 and a plurality of upper electrodes 32. Although not illustrated, the lower electrodes 31 are disposed on the top surface 101a of the substrate 101. The magnetic detection elements 220 are disposed on the lower electrodes 31. The upper electrodes 32 are disposed on the magnetic detection elements 220. The yokes 11 are disposed above the upper electrodes 32. FIG. 2 depicts the yoke 11 and upper electrodes 32 as separate from the magnetic detection elements 220 and lower electrodes 31 in the Z direction. In FIG. 2, the broken lines labeled 32a indicate the positions of lower surfaces of the upper electrodes 32.

As shown in FIG. 1 to FIG. 4, the magnetic sensor 1 further includes a magnetic film 15 formed of a soft magnetic material, and nonmagnetic films 41 and 42 formed of a nonmagnetic insulating material. The nonmagnetic film 41 is disposed on the top surface 101a of the substrate 101 to surround the first to fourth resistor sections 21 to 24 and the wiring section 30. The nonmagnetic film 42 is disposed to cover the first to fourth resistor sections 21 to 24, the wiring section 30 and the nonmagnetic film 41. The magnetic film 15 is disposed on the nonmagnetic film 42. The yokes 11 are disposed on the magnetic film 15.

Figure 8:
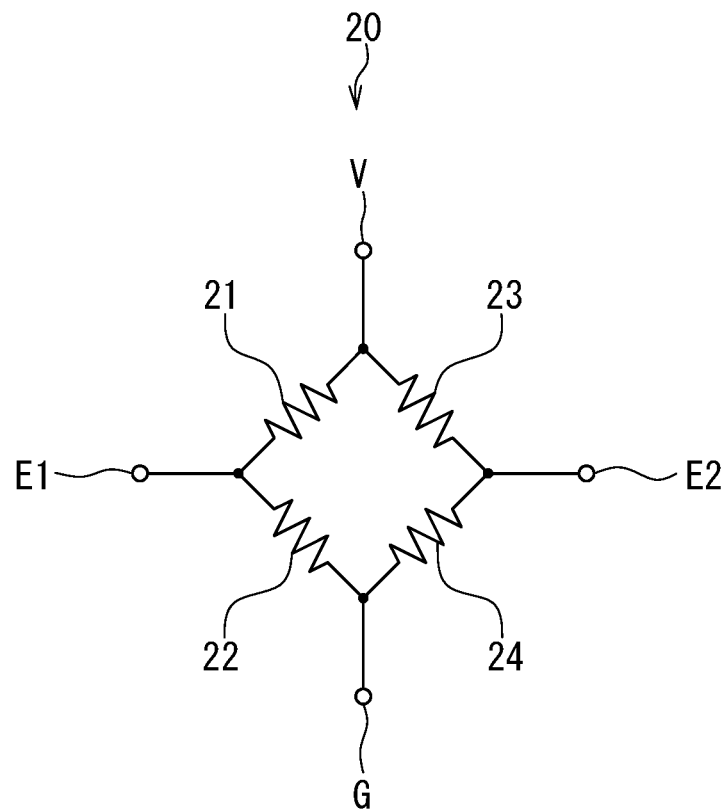
FIG. 8 is a circuit diagram illustrating the circuit configuration of a magnetic field detection unit of the first embodiment of the invention.

Reference is now made to FIG. 8 to describe the circuit configuration of the magnetic field detection unit 20. FIG. 8 is a circuit diagram illustrating the circuit configuration of the magnetic field detection unit 20. The magnetic field detection unit 20 further includes a power supply port V, a ground port a first output port E1, and a second output port E2. The first resistor section 21 is provided between the power supply port V and the first output port E1. The second resistor section 22 is provided between the first output port E1 and the ground port G. The third resistor section 23 is provided between the power supply port V and the second output port E2. The fourth resistor section 24 is provided between the second output port E2 and the ground port G.

The magnetic field detection unit 20 is configured to be energized between the power supply port V and the ground port G. The first resistor section 21 and the second resistor section 22 in the magnetic field detection unit 20 are connected in series and configured to be energized. The third resistor section 23 and the fourth resistor section 24 in the magnetic field detection unit 20 are also connected in series and configured to be energized. The power supply port V and the ground port G are electrically connected to two electrode pads 102 between which a power supply voltage of a predetermined magnitude is applied, among the plurality of electrode pads 102 shown in FIG. 10. Note that the first and second output ports E1 and E2 are electrically connected to other two electrode pads 102 of the plurality of electrode pads 102. As will be described later, the magnetic field detection unit 20 generates a signal that depends on the potential difference between the first output port E1 and the second output port E2, as an output signal.

Now, with reference to FIG. 1 and FIG. 2, a description will be given of the connection relationships between the magnetic detection elements 220 and the upper and lower electrodes 32 and 31. In the present embodiment, the first magnetic detection elements 220 are magnetoresistive elements. Hereinafter, the magnetic detection element(s) 210 will also be referred to as the magnetoresistive element(s) 220. Here, by way of example, the magnetic detection element trains 121 of the first resistor section 21 will be described.

As shown in FIG. 2, each of the lower electrodes 31 is shaped to be elongated in the Y direction. A gap is formed between every two lower electrodes 31 adjacent in the Y direction. A pair of magnetoresistive elements 220 is disposed on a portion of the top surface of each lower electrode 31 near each of opposite ends in the Y direction, the paired magnetoresistive elements 220 being adjacent to each other in the X direction. Such a pair of magnetoresistive elements 220 will hereinafter be referred to as an element pair. In the present embodiment, the magnetic detection element trains 121 each include a plurality of element pairs aligned in the Y direction. The magnetoresistive elements 220 are each shaped to be elongated in a direction parallel to the third virtual straight line Ly.

Each of the upper electrodes 32 establishes electrical connection between two magnetoresistive elements 220 constituting each single element pair. The two magnetoresistive elements 220 constituting each single element pair are thereby connected in parallel. Each of the upper electrodes 32 further establishes electrical connection between two adjacent element pairs that are disposed on two lower electrodes 31 adjacent in the Y direction. A plurality of element pairs are thereby connected in series.

As shown in FIG. 1, the wiring section 30 further includes a plurality of connection electrodes 33. The connection electrodes 33 establish electrical connection between the lower electrodes 31 so that the magnetic detection element trains 121 are connected in series.

In each of the magnetic detection element trains 122, 123 and 124 in the second, third and fourth resistor sections 22, 23 and 24, respectively, the magnetoresistive elements 220, the lower electrodes 31, the upper electrodes 32 and the connection electrodes 33 are connected in the same connection relationships as those in the magnetic detection element trains 121 in the first resistor section 21 described with reference to FIG. 2.

Figure 9:
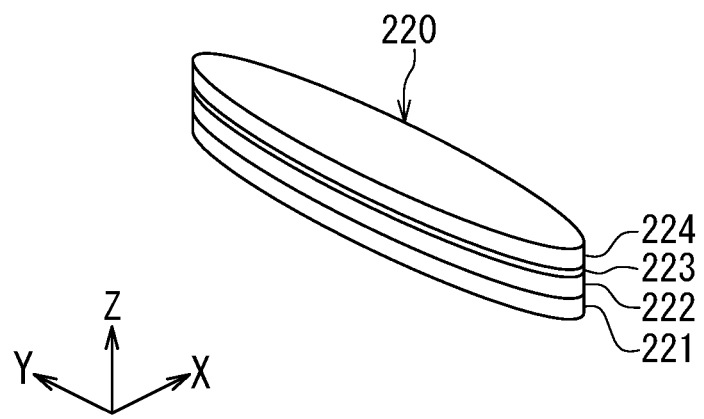
FIG. 9 is a perspective view of a magnetoresistive element of the first embodiment of the invention.

An example of configuration of the magnetoresistive elements 220 will now be described with reference to FIG. 2 and FIG. 9. FIG. 9 is a perspective view of a magnetoresistive element 220. In this example, the magnetoresistive element 220 includes a magnetization pinned layer 222 whose magnetization direction is pinned, a free layer 224 which is a magnetic layer whose magnetization direction varies depending on the direction and strength of the output magnetic field component, a nonmagnetic layer 223 between the magnetization pinned layer 222 and the free layer 224, and an antiferromagnetic layer 221. The antiferromagnetic layer 221, the magnetization pinned layer 222, the nonmagnetic layer 223, and the free layer 224 are stacked in this order, the antiferromagnetic layer 221 being closest to the lower electrode 31. The antiferromagnetic layer 221 is formed of an antiferromagnetic material. The antiferromagnetic layer 221 is in exchange coupling with the magnetization pinned layer 222 so as to pin the magnetization direction of the magnetization pinned layer 222.

The magnetoresistive element 220 may be a tunneling magnetoresistive (TMR) element or a giant magnetoresistive (GMR) element. In the TMR element, the nonmagnetic layer 223 is a tunnel barrier layer. In the GMR element, the nonmagnetic layer 223 is a nonmagnetic conductive layer.

The magnetoresistive element 220 varies in resistance value depending on the angle that the magnetization direction of the free layer 224 forms with the magnetization direction of the magnetization pinned layer 222. The magnetoresistive element 220 has the lowest resistance value when the foregoing angle is 0°, and the highest resistance value when the foregoing angle is 180°.

The magnetization pinned layers 222 of the magnetoresistive elements 220 in the first resistor section 21 are magnetized in the −X direction. In FIG. 2, the arrow labeled 51 indicates such a magnetization direction.

The magnetization pinned layers 222 of the magnetoresistive elements 220 in the third resistor section 23 are magnetized in the −X direction. In FIG. 2, the arrow labeled 52 indicates such a magnetization direction.

Although not illustrated, the magnetization pinned layers 222 of the magnetoresistive elements 220 in the second resistor section 22 and those in the fourth resistor section 24 are magnetized in the X direction.

In the present embodiment, as previously mentioned, each of the magnetoresistive elements 220 is shaped to be elongated in a direction parallel to the third virtual straight line Ly. This causes the free layer 224 of each of the magnetoresistive elements 220 to have a shape anisotropy that establishes an easy axis direction parallel to the third virtual straight line Ly. Thus, when there is no output magnetic field component, the magnetization direction of the free layer 224 is parallel to the third virtual straight line Ly. When there is an output magnetic field component, the magnetization direction of the free layer 224 varies depending on the direction and strength of the output magnetic field component. Thus, in each of the magnetoresistive elements 220, the angle that the magnetization direction of the free layer 224 forms with the magnetization direction of the magnetization pinned layer 222 varies depending on the direction and strength of the output magnetic field component received by the magnetoresistive element 220. The resistance value of each magnetoresistive element 220 thus corresponds to the output magnetic field component received by the magnetoresistive element 220.

In the present embodiment, the direction of the output magnetic field components received by the magnetoresistive elements 220 in the second resistor section 22 is the same as the direction of the output magnetic field components received by the magnetoresistive elements 220 in the first resistor section 21. On the other hand, the direction of the output magnetic field components received by the magnetoresistive elements 220 in the third resistor section 23 and the direction of the output magnetic field components received by the magnetoresistive elements 220 in the fourth resistor section 24 are opposite to the direction of the output magnetic field components received by the magnetoresistive elements 220 in the first resistor section 21.

A composite resistance value of two magnetoresistive elements 220 constituting an element pair is given by R/2, where R represents the resistance value of a single magnetoresistive element 220. The resistance value of each of the first to fourth resistor sections 21 to 24 is given by nR/2, where n is the number of element pairs included in the resistor section. The resistance value R corresponds to the detection value provided by the magnetic detection element 220.

Possible configurations of the magnetoresistive elements 220 are not limited to the example described with reference to FIG. 2 and FIG. 9. For example, the magnetoresistive elements 220 may be configured without the antiferromagnetic layer 221. In such a case, for example, a magnetization pinned layer of an artificial antiferromagnetic structure including two ferromagnetic layers and a nonmagnetic metal material between the two ferromagnetic layers may be provided in place of the antiferromagnetic layer 221 and the magnetization pinned layer 222. The magnetic detection elements 220 may be elements that are other than magnetoresistive elements and configured to detect a magnetic field, such as Hall elements and magnetic impedance elements.

The positional relationship between the yokes 11 and the magnetic detection element trains 121 to 124 will now be described. As shown in FIG. 1, two or more yokes 11 among all the yokes 11 are each disposed to intersect a YZ plane that passes between one magnetic detection element train 121 and one magnetic detection element train 123 that is adjacent to the X-direction side of the magnetic detection element train 121. The remaining two or more yokes 11 among all the yokes 11 are each disposed to intersect a YZ plane that passes between one magnetic detection element train 122 and one magnetic detection element train 124 that is adjacent to the X-direction side of the magnetic detection element train 122.

Figure 5:
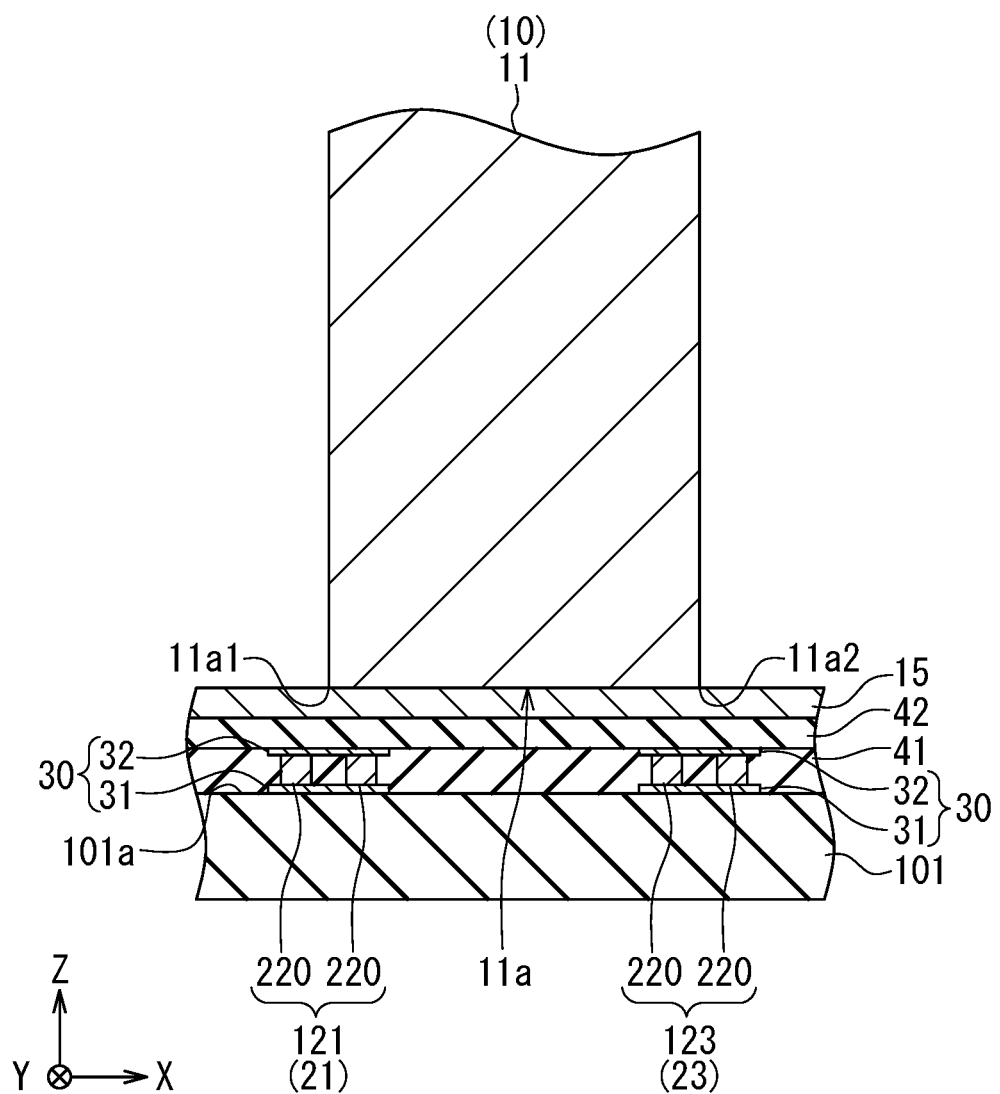
FIG. 5 is a cross-sectional view showing part of FIG. 4 on an enlarged scale.

Reference is now made to FIG. 4 and FIG. 5 to describe the positional relationship between one yoke 11, one magnetic detection element train 121 and one magnetic detection element train 123, which will hereinafter be referred to as the first positional relationship. FIG. 5 is a cross-sectional view showing part of FIG. 4 on an enlarged scale.

As shown in FIG. 4, one yoke 11 is located above the magnetic detection element trains 121 and 123. The yoke 11 has a first end 11a and a second end 11b opposite to each other in a direction parallel to the first virtual straight line Lz. In the present embodiment, the first end 11a is a plane that is located at the end in the −Z direction of the yoke 11 and is perpendicular to the first virtual straight line Lz, and the second end 11b is a plane that is located at the end in the Z direction of the yoke 11 and is perpendicular to the first virtual straight line Lz. As shown in FIG. 4 and FIG. 5, the first end 11a has a first edge 11a1 and a second edge 11a2. The first edge 11a1 is located at the end in the −X direction of the first end 11a, and the second edge 11a2 is located at end in the X direction of the first end 11a.

As shown in FIG. 4 and FIG. 5, the magnetic detection element train 121 is located near the first edge 11a1. The magnetic detection element train 123 is located near the second edge 11a2.

In the present embodiment, as shown in FIG. 5, one of two magnetic detection elements 220 constituting an element pair is disposed to overlap the yoke 11 when viewed from above, whereas the other is disposed so as not to overlap the yoke 11 when viewed from above. For the sake of convenience, in FIG. 1 the magnetic detection element trains 121 and 123 are drawn so as not to overlap the yoke 11.

The positional relationship between one yoke 11, one magnetic detection element train 122 and one magnetic detection element train 124, which will hereinafter be referred to as the second positional relationship, is similar to the first positional relationship. Replacing the magnetic detection element trains 121 and 123 in the description of the first positional relationship with the magnetic detection element trains 122 and 124, respectively, provides a description of the second positional relationship. As shown in FIG. 4, the magnetic detection element train 122 is located near the first edge 11a1. The magnetic detection element train 124 is located near the second edge 11a2.

The first and second positional relationships are not limited to the above-described example. For example, the magnetic detection element trains 121 to 124 may be disposed to be entirely inside or outside the perimeter of the yoke 11 when viewed from above.

Figure 6:
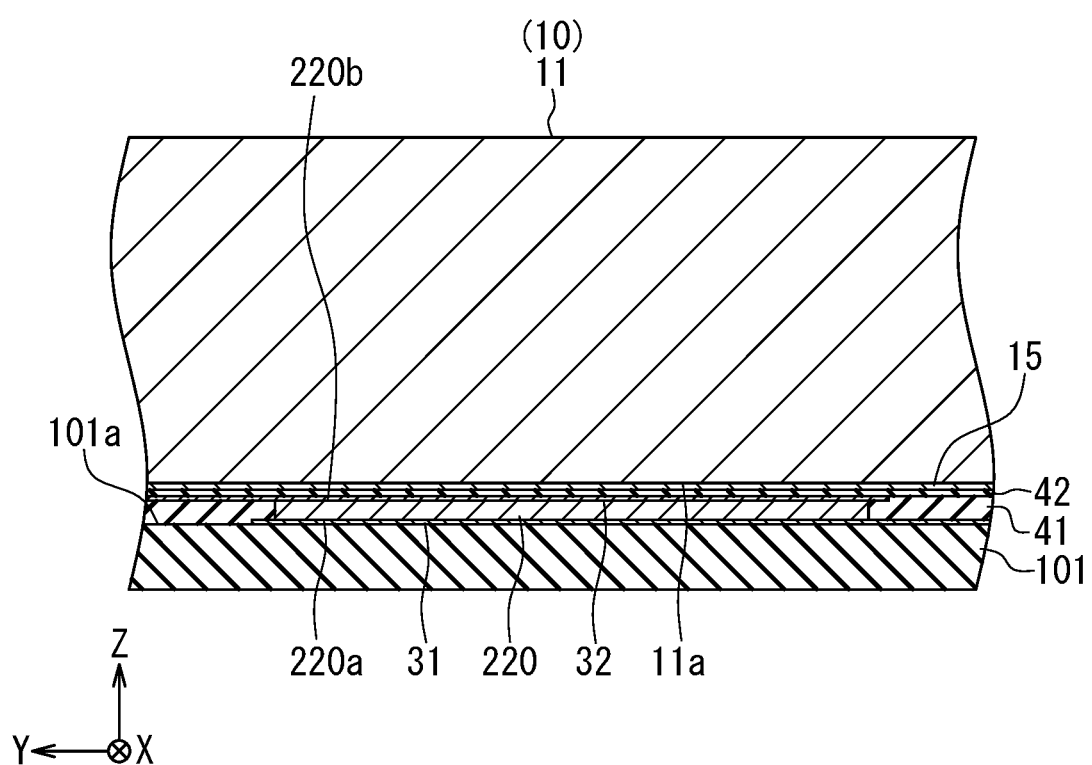
FIG. 6 is a cross-sectional view showing a cross section of part of the magnetic sensor according to the first embodiment of the invention, the cross section being perpendicular to X direction.
Figure 7:
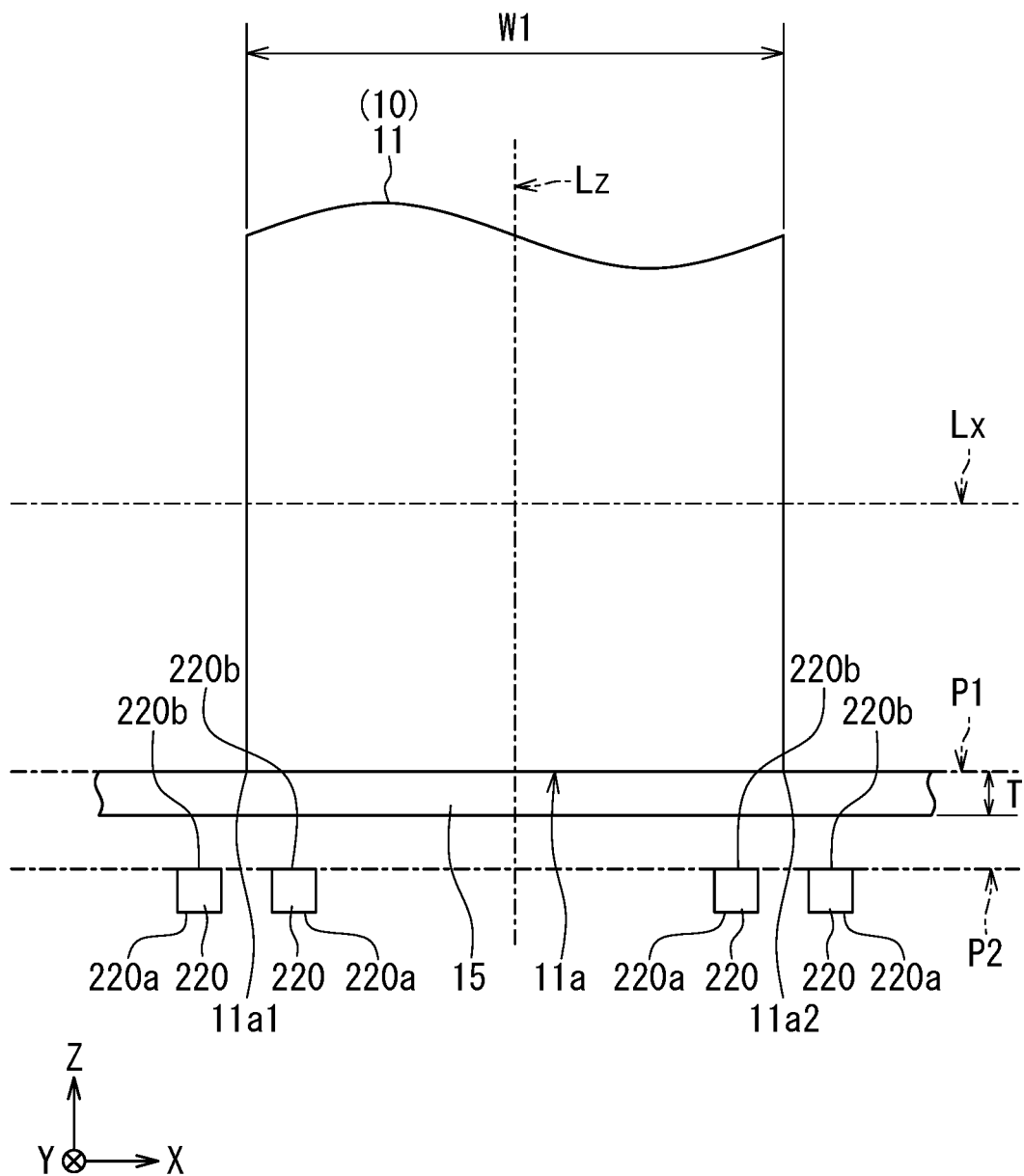
FIG. 7 is an explanatory diagram for explaining the positional relationship between a yoke, the magnetic film and magnetic detection elements and shapes thereof.

Reference is now made to FIGS. 3, 6 and 7 to describe the shape of the magnetic film 15 and the positional relationship between one yoke 11, the magnetic film 15 and the magnetic detection elements 220. FIG. 6 is a cross-sectional view showing a cross section of part of the magnetic sensor 1 perpendicular to the X direction. FIG. 7 is an explanatory diagram for explaining the positional relationship between the yoke 11, the magnetic film 15 and the magnetic detection elements 220 and shapes thereof. Here, by way of example, one magnetic detection element 220 and one yoke 11 that is closest to the magnetic detection element 220 will be described.

As shown in FIG. 6 and FIG. 7, the magnetic detection element 220 has a third end 220a and a fourth end 220b opposite to each other in a direction parallel to the first virtual straight line Lz. In the present embodiment, the third end 220a is located at the end in the −Z direction of the magnetic detection element 220, and the fourth end 220b is located at the end in the Z direction of the magnetic detection element 220. The fourth end 220b is closer to the yoke 11 than is the third end 220a.

As described previously, the yoke 11 has the first end 11a and the second end 11b. The first end 11a is closer to the magnetic detection element 220 than is the second end 11b.

Assume here that there are a first virtual plane P1 and a second virtual plane P2, as shown in FIG. 7. The first virtual plane P1 includes the first end 11a, intersects the first virtual straight line Lz and is parallel to the second virtual straight line Lx. The second virtual plane P2 includes the fourth end 220b and is parallel to the first virtual plane P1. In the present embodiment, the first and second virtual planes P1 and P2 are orthogonal to the first virtual straight line Lz. The magnetic film 15 is located within a spatial range extending from the first virtual plane P1 to the second virtual plane P2. In the present embodiment, the magnetic film 15 is in contact with the first end 11a of the yoke 11.

Further, as shown in FIG. 7, the yoke 11 has a width W1, which is a dimension in a direction parallel to the second virtual straight line Lx. The magnetic film 15 has a thickness T, which is a dimension in a direction parallel to the first virtual straight line Lz. The thickness T is smaller than the width W1, and is preferably smaller than or equal to one-half the width W1. For example, the width W1 is 2.6 μm. The specific value of the thickness T will be described later.

Further, as shown in FIG. 3, the magnetic film 15 has a width W2, which is a dimension in a direction parallel to the second virtual straight line Lx. The width W2 of the magnetic film 15 is greater than the width W1 of the yoke 11.

In the present embodiment, as shown in FIG. 3, the magnetic field conversion unit 10 includes a plurality of yokes 11. The first ends 11a of all the yokes 11 are included in the first virtual plane P1. The magnetic film 15 is in contact with the first ends 11a of all the yokes 11. The width W2 of the magnetic film 15 is greater than the distance between the first edge 11a1 of the yoke 11 that is located at the end in the −X direction and the second edge 11a2 of the yoke 11 that is located at the end in the X direction. The aforementioned distance is 160 μm, for example. The width W2 is 165 μm, for example.

As shown in FIG. 3, the yoke 11 has a dimension D1 in a direction parallel to the third virtual straight line Ly, and the magnetic film 15 has a dimension D2 in the same direction. The dimension D2 is greater than or equal to the dimension D1. The dimension D1 is 78 μm, for example. The dimension D2 is 100 μm, for example.

In the present embodiment, the fourth ends 220b of all the magnetic detection elements 220 are included in the second virtual plane P2.

Now, a description will be given of the resistance values of the first to fourth resistor sections 21 to 24 and the output signal to be generated by the magnetic field detection unit 20. In the present embodiment, when no output magnetic field component is present, the magnetization direction of the free layer 224 of each magnetoresistive element 220 is parallel to the third virtual straight line Ly. When the input magnetic field component is in the Z direction, the output magnetic field components received by the magnetoresistive elements 220 in the first and second resistor sections 21 and 22 are in the X direction, whereas the output magnetic field components received by the magnetoresistive elements 220 in the third and fourth resistor sections 23 and 24 are in the −X direction. In this case, the magnetization direction of the free layer 224 of each magnetoresistive element 220 in the first and second resistor sections 21 and 22 is inclined from the direction parallel to the third virtual straight line Ly toward the X direction, and the magnetization direction of the free layer 224 of each magnetoresistive element 220 in the third and fourth resistor sections 23 and 24 is inclined from the direction parallel to the third virtual straight line Ly toward the −X direction. As a result, relative to the case where no output magnetic field component is present, the magnetoresistive elements 220 in the first and fourth resistor sections 21 and 24 increase in resistance value, and the first and fourth resistor sections 21 and 24 also increase in resistance value. On the other hand, the magnetoresistive elements 220 in the second and third resistor sections 22 and 23 decrease in resistance value, and the second and third resistor sections 22 and 23 also decrease in resistance value, relative to the case where no output magnetic field component is present.

When the input magnetic field component is in the −Z direction, the direction of the output magnetic field components and the changes in the resistance values of the first to fourth resistor sections 21 to 24 are opposite to those in the aforementioned case in which the input magnetic field component is in the Z direction.

The amount of change in the resistance value of each magnetoresistive element 220 depends on the strength of the output magnetic field component received by the magnetoresistive element 220. The resistance value of each magnetoresistive element 220 increases or decreases by a larger amount with increasing strength of the output magnetic field component. The resistance value of each magnetoresistive element 220 increases or decreases by a smaller amount with decreasing strength of the output magnetic field component. The strength of the output magnetic field component depends on the strength of the input magnetic field component.

As described above, changes in the direction and strength of the input magnetic field component cause the resistance values of the first to fourth resistor sections 21 to 24 to change such that the resistance values of the first and fourth resistor sections 21 and 24 increase while the resistance values of the second and third resistor sections 22 and 23 decrease, or such that the resistance values of the first and fourth resistor sections 21 and 24 decrease while the resistance values of the second and third resistor sections 22 and 23 increase. This causes a change in the potential difference between the first output port E1 and the second output port E2 shown in FIG. 1 and FIG. 8. The magnetic field detection unit 20 generates a signal that depends on the potential difference between the first output port E1 and the second output port E2, as an output signal.

A manufacturing method for the magnetic sensor 1 according to the present embodiment will now be described briefly. The manufacturing method for the magnetic sensor 1 according to the present embodiment includes the steps of: forming the magnetic field detection unit 20 and the wiring section 30; forming the nonmagnetic film 41 and the nonmagnetic film 42 in succession after the foregoing step; forming the magnetic film 15 on the nonmagnetic film 42; and forming the magnetic field conversion unit 10 on the magnetic film 15.

The step of forming the magnetic field detection unit 20 includes the step of forming the first to fourth resistor sections 21 to 24. The step of forming the first to fourth resistor sections 21 to 24 includes the step of forming the magnetic detection elements 220.

The step of forming the magnetic field conversion unit 10 includes the step of forming the yokes 11. In the step of forming the yokes 11, the yokes 11 are formed by frame plating, for example. In this step, the magnetic film 15 is used as a seed and an electrode.

In general, in forming a yoke by frame plating, an electrode film to be used as a seed and an electrode is initially formed, and then the yoke is formed. Thereafter, unwanted portions of the electrode film not covered by the yoke are removed by etching. In such a case, any attempts to completely remove the unwanted portions of the electrode film may result in overetching to cause damage to the magnetic detection element. On the other hand, if the removal of the unwanted portions is insufficient, the yoke may vary in characteristics depending on how much the unwanted portions remain unremoved.

In contrast, the manufacturing method for the magnetic sensor 1 according to the present embodiment is free from the aforementioned problem because the method does not involve etching of the magnetic film 15.

The function and effects of the magnetic sensor 1 according to the present embodiment will now be described. The magnetic sensor 1 according to the present embodiment is configured to detect the output magnetic field component which varies depending on the input magnetic field component in a direction parallel to the first virtual straight line Lz. Magnetic fields that are in a direction to which the magnetic detection elements 220 have sensitivity and are other than the output magnetic field component act as noise magnetic fields on the magnetic sensor 1. Examples of the noise magnetic fields include a magnetic field in a direction parallel to the second virtual straight line Lx and a magnetic field in a direction parallel to the third virtual straight line Ly, other than the output magnetic field component. The present embodiment enables the magnetic film 15 to absorb part of a magnetic flux resulting from a noise magnetic field, thereby inhibiting application of the noise magnetic field to the magnetic detection elements 220. A magnetic flux resulting from a noise magnetic field will hereinafter be referred to as noise magnetic flux.

Requirements for the shape of the magnetic film 15 will now be described. It is required that the thickness T of the magnetic film 15 be smaller than the width W1 of the yokes 11. This requirement will be referred to as the first requirement. It is also required that the width W2 of the magnetic film 15 be greater than the width W1 of the yokes 11. This requirement will be referred to as the second requirement.

In the present embodiment, the output magnetic field is generated from the first end 11a of each yoke 11. A magnetic flux corresponding to the output magnetic field will be referred to as output magnetic flux. A part of the output magnetic flux is absorbed by the magnetic film 15. Another part of the output magnetic flux passes through the magnetic film 15 and reaches a magnetic detection element 220.

If the thickness T of the magnetic film 15 is too large, the proportion of the magnetic flux absorbed by the magnetic film 15 with regard to the output magnetic flux becomes so high that the magnetic flux reaching the magnetic detection element 220 decreases. As a result, the ratio of the strength of the output magnetic field component applied to a magnetic detection element 220 to the strength of the input magnetic field component decreases significantly. From the standpoint of preventing this, the present embodiment provides for the first requirement.

In the present embodiment, the yokes 11 also have the function of absorbing some of noise magnetic flux. If the width W2 of the magnetic film 15 is smaller than or equal to the width W1 of the yokes 11, the capacity of the yokes 11 and the magnetic film 15 to absorb the noise magnetic flux is not much different from that of the yokes 11 alone. In contrast, if the width W2 of the magnetic film 15 is made greater than the width W1 of the yokes 11 as in the present embodiment, the magnetic film 15 is able to absorb the part of the noise magnetic flux that does not pass through the yokes 11. This provides the meaning of the presence of the magnetic film 15. The present embodiment thus requires the second requirement.

The effect of the present embodiment will now be described with reference to the results of first and second simulations. To begin with, an example model and a comparison model used in the first and second simulations will be described. The example model is a model corresponding to the magnetic sensor 1 according to the present embodiment. The comparison model is a model of a magnetic sensor of a comparative example. The magnetic sensor of the comparative example has the same configuration as that of the magnetic sensor 1 according to the present embodiment except that there is no magnetic film 15.

In each of the example model and the comparison model, the number of the yokes 11 is six. Here, an origin is set on the first virtual plane P1. The six yokes 11 are symmetrically arranged, three each on the −X-direction side and the X-direction side of the origin. The six yokes 11 are also arranged such that a virtual straight line passing through the centers in the Y direction of the respective first ends 11a of the six yokes 11 passes through the origin.

The width W1 (see FIG. 7) of each yoke 11 is 2.6 µm, and the dimension D1 (see FIG. 3) of each yoke 11 is 78 µm. The distance between the first edge 11a1 of the yoke 11 located at the end in the −X direction and the second edge 11a2 of the yoke 11 located at the end in the X direction is 65 µm. The dimension of each yoke 11 in a direction parallel to the first virtual straight line Lz will be described later.

In the example model, the width W2 (see FIG. 3) of the magnetic film 15 is 75 µm, and the dimension D2 (see FIG. 3) of the magnetic film 15 is 100 µm. The thickness T of the magnetic film 15 will be described later.

Next, the result of the first simulation will be described. In the first simulation, the effect of a noise magnetic field in a direction parallel to the second virtual straight line Lx was examined. Assume here that there is a fourth virtual straight line that lies below the first virtual plane P1 and is parallel to the second virtual straight line Lx. The fourth virtual straight line is based on positions at which the plurality of magnetic detection elements 220 are to be disposed, and intersects with the plurality of magnetic detection elements 220. A straight line formed by projecting the fourth virtual straight line upon the first virtual plane P1 passes through the origin.

In the first simulation, an external magnetic field in the X direction was applied as the noise magnetic field to the example model and the comparison model, and a magnetic flux density at each position on the fourth virtual straight line was determined. Then, at each position on the fourth virtual straight line, the ratio of a magnetic flux density at the position to a magnetic flux density obtained from the strength of the external magnetic field was obtained. Hereinafter, the aforementioned ratio will be referred to as passing rate.

In the first simulation, the applied external magnetic field had such a strength that a magnetic flux density of 10 mT be obtained. The dimension of each yoke 11 in a direction parallel to the first virtual straight line Lz was set to 2.5 µm. The thickness T of the magnetic film 15 was set to 1.0 µm. In the comparison model, the distance between the first virtual plane P1 and the fourth virtual straight line was set to 1.25 µm. In the example model, the distance between the first virtual plane P1 and the fourth virtual straight line was set to the thickness T plus 0.25 µm, i.e., 1.25 µm.

Figure 11:
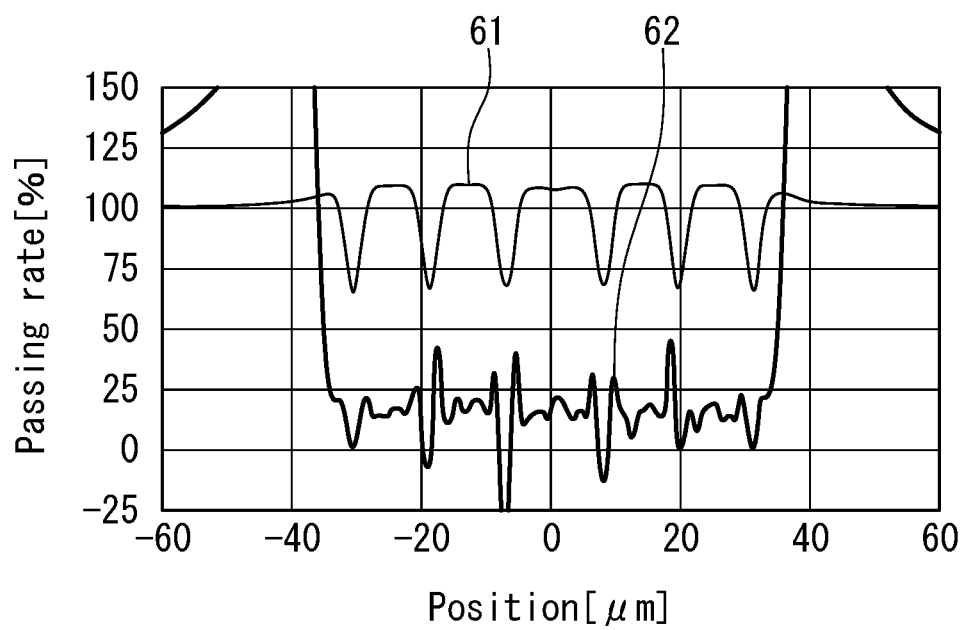
FIG. 11 is a characteristic chart illustrating the results of a first simulation.

FIG. 11 shows the result of the first simulation. In FIG. 11, the horizontal axis represents positions on the fourth virtual straight line, and the vertical axis represents passing rate. On the fourth virtual straight line, any position located forward of the origin in the −X direction is expressed in a negative value, and any position located forward of the origin in the X direction is expressed in a positive value. The position of −32.5 µm is the position on the fourth virtual straight line corresponding to the first edge 11a1 of the yoke 11 that lies at the end in the −X direction. The position of 32.5 µm is the position on the fourth virtual straight line corresponding to the second edge 11a2 of the yoke 11 that lies at the end in the X direction. In FIG. 11, the reference numeral 61 denotes the characteristic of the comparison model, and the reference numeral 62 denotes the characteristic of the example model. As shown in FIG. 11, in the example model the passing rates at the positions at which the magnetic detection elements 220 are to be disposed are lower than those in the comparison model. In other words, in the example model, the magnetic flux densities at the positions at which the magnetic detection elements 220 are to be disposed are lower than those in the comparison model. The is considered to be due to part of the magnetic flux resulting from the external magnetic field being absorbed by the magnetic film 15.

Next, the result of the second simulation will be described. In the second simulation, the effect of a noise magnetic field in a direction parallel to the third virtual straight line Ly was examined. Assume here that there is a fifth virtual straight line that lies below the first virtual plane P1 and is parallel to the third virtual straight line Ly. The fifth virtual straight line is based on positions at which the plurality of magnetic detection elements 220 are to be disposed, and intersects with the plurality of magnetic detection elements 220. The fifth virtual straight line is located to overlap the first end 11a of any one of the six yokes 11 when viewed from above.

In the second simulation, an external magnetic field in the Y direction was applied as the noise magnetic field to the example model and the comparison model, and a magnetic flux density at each position on the fifth virtual straight line was determined. Then, at each position on the fifth virtual straight line, passing rate, i.e., the ratio of a magnetic flux density at the position to a magnetic flux density obtained from the strength of the external magnetic field, was obtained.

In the second simulation, the applied external magnetic field had such a strength that a magnetic flux density of 10 mT be obtained. The dimension of each yoke 11 in a direction parallel to the first virtual straight line Lz was set to 5 µm. The thickness T of the magnetic film 15 was set to 1.0 µm. In the comparison model, the distance between the first virtual plane P1 and the fifth virtual straight line was set to 1.25 µm. In the example model, the distance between the first virtual plane P1 and the fifth virtual straight line was set to the thickness T plus 0.25 µm, i.e., 1.25 µm.

Figure 12:
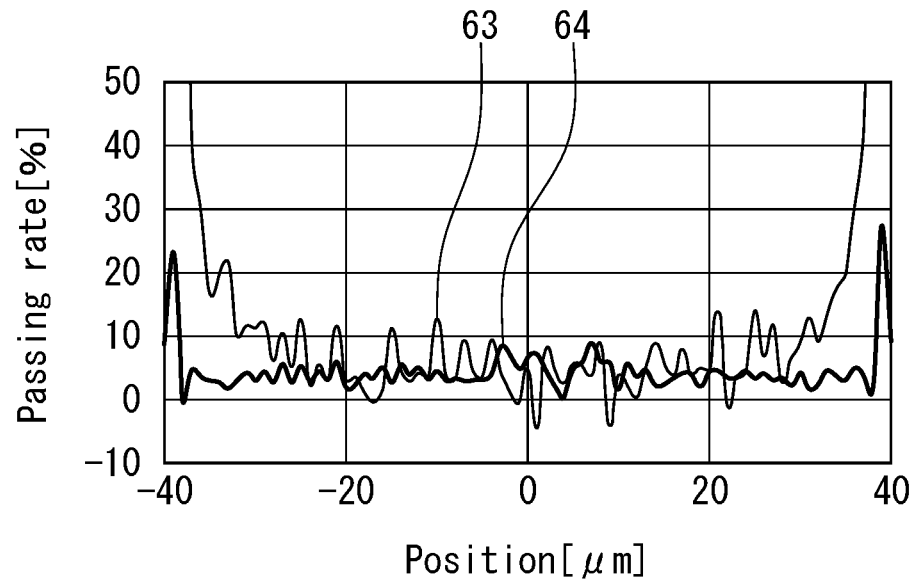
FIG. 12 is a characteristic chart illustrating the results of a second simulation.

FIG. 12 shows the result of the second simulation. In FIG. 12, the horizontal axis represents positions on the fifth virtual straight line, and the vertical axis represents passing rate. On the fifth virtual straight line, any position located forward of the origin in the -Y direction is expressed in a negative value, and any position located forward of the origin in the Y direction is expressed in a positive value. The position of -39 µm is the position on the fifth virtual straight line corresponding to the end in the -Y direction of the first end 11a of one yoke 11, and the position of 39 µm is the position on the fifth virtual straight line corresponding to the end in the Y direction of the first end 11a of the yoke 11. In FIG. 12, the reference numeral 63 denotes the characteristic of the comparison model, and the reference numeral 64 denotes the characteristic of the example model. As shown in FIG. 12, in the example model the passing rates at the positions ranging from approximately -39 µm to -20 µm and at the positions ranging from approximately 20 µm to 39 µm on the fifth virtual straight line corresponding to the first ends 11a of the yokes 11 are lower than those in the comparison model. In other words, in the example model, the magnetic flux densities at the positions within the foregoing two ranges are lower than those in the comparison model. This is considered to be due to part of the magnetic flux resulting from the external magnetic field being absorbed by the magnetic film 15.

As can be seen from the results of the first and second simulations, the present embodiment enables the magnetic film 15 to absorb part of a noise magnetic flux, thereby inhibiting application of a noise magnetic field to the magnetic detection elements 220.

Next, the result of a third simulation will be described. In the third simulation, a preferred range of the thickness T (see FIG. 7) of the magnetic film 15 was examined using the example model used in the first and second simulations.

In the third simulation, an external magnetic field in the Z direction was applied as an input magnetic field component to the example model, and the output magnetic field component at each position on the fourth virtual straight line was determined. Then, at each position on the fourth virtual straight line, the ratio of a magnetic flux density obtained from the strength of the output magnetic field component to a magnetic flux density obtained from the strength of the external magnetic field was determined. Hereinafter, the aforementioned ratio will be referred to as conversion efficiency.

In the third simulation, the applied external magnetic field had such a strength that a magnetic flux density of 30 mT be obtained. The dimension of each yoke 11 in a direction parallel to the first virtual straight line Lz was set to 5 µm. The thickness T of the magnetic film 15 was varied within the range of 0.1 to 1.3 µm. The distance between the first virtual plane P1 and the fourth virtual straight line was set to the thickness T plus 0.25 µm.

Figure 13:
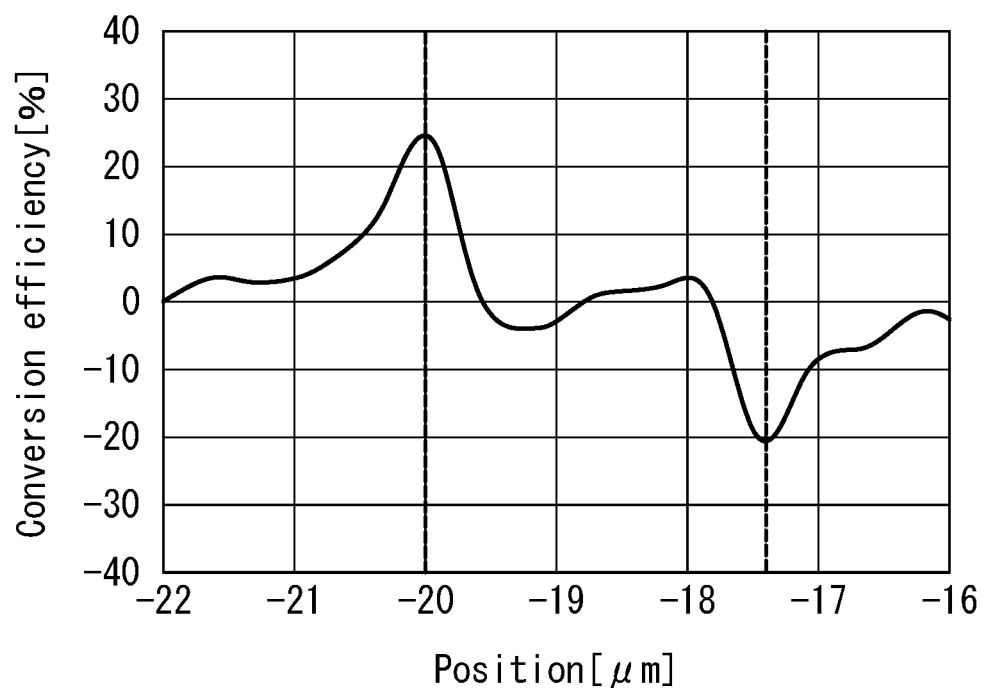
FIG. 13 is a characteristic chart illustrating an example of conversion efficiency obtained from a third simulation.

FIG. 13 is a characteristic chart illustrating an example of the conversion efficiency obtained from the third simulation. In FIG. 13, the horizontal axis represents positions on the fourth virtual straight line, and the vertical axis represents conversion efficiency. Positions on the fourth virtual straight line are expressed in the same manner as in FIG. 11. The position of -20 µm is the position on the fourth virtual straight line corresponding to the first edge 11a1 (see FIG. 7) of a yoke 11 located forward of the origin in the -X direction. The position of -17.4 µm is the position on the fourth virtual straight line corresponding to the second edge 11a2 (see FIG. 7) of the aforementioned yoke 11. In the example shown in FIG. 13, the conversion efficiency peaks at the position on the fourth virtual straight line corresponding to the first edge 11a1. The maximum value of the conversion efficiency will hereinafter be referred to as maximum conversion efficiency.

Figure 14:
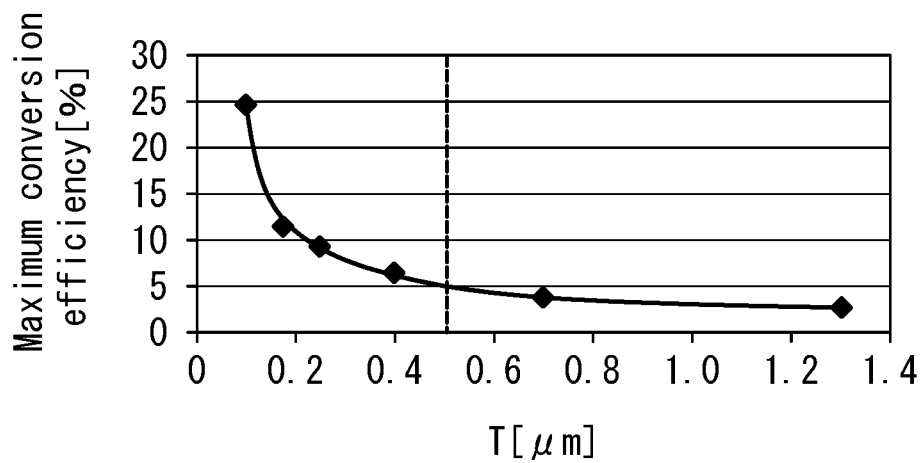
FIG. 14 is a characteristic chart illustrating the relationship between the thickness of the magnetic film and a maximum conversion efficiency, obtained from the third simulation.

FIG. 14 is a characteristic chart illustrating the relationship between the thickness T of the magnetic film and the maximum conversion efficiency, obtained from the third simulation. In FIG. 14, the horizontal axis represents the thickness T, and the vertical axis represents the maximum conversion efficiency. The maximum conversion efficiency is preferably 2.5% and above, more preferably 5% and above. With the thickness T in the range shown in FIG. 14, the maximum conversion efficiency remains at or above 2.5%. In FIG. 14, the broken line indicates the position at which the thickness T is 0.5 µm. If the thickness T is 0.5 µm or less, the maximum conversion efficiency is 5% or more. The thickness T is thus preferably in the range of 0.1 to 1.3 µm, more preferably in the range of 0.1 to 0.5 µm. The value of 0.1 µm corresponds to the smallest possible thickness T of the magnetic film 15.

In the third simulation, the width W1 of each yoke 11 is 2.6 µm. The thickness T can thus be said to be preferably smaller than or equal to one-half the width W1.

The configuration of the magnetic sensors 2 and 3 of the magnetic sensor unit 100 shown in FIG. 10 will now be briefly described. The configuration of the magnetic sensors 2 and 3 is basically the same as that of the magnetic sensor 1 according to the present embodiment. However, the magnetic sensors 2 and 3 are configured without the magnetic field conversion unit 10. The magnetic sensor 2 is configured to detect a magnetic field in the Y direction. To be more specific, for example, in the magnetic sensor 2 the magnetization pinned layers 222 of the magnetoresistive elements 220 included in the first and fourth resistor sections 21 and 24 are magnetized in the Y direction, and the magnetization pinned layers 222 of the magnetoresistive elements 220 included in the second and third resistor sections 22 and 23 are magnetized in the -Y direction.

The magnetic sensor 3 is configured to detect a magnetic field in the X direction. To be more specific, for example, in the magnetic sensor 3 the magnetization pinned layers 222 of the magnetoresistive elements 220 included in the first and fourth resistor sections 21 and 24 are magnetized in the X direction, and the magnetization pinned layers 222 of the magnetoresistive elements 220 included in the second and third resistor sections 22 and 23 are magnetized in the −X direction.

Second Embodiment

Figure 15:
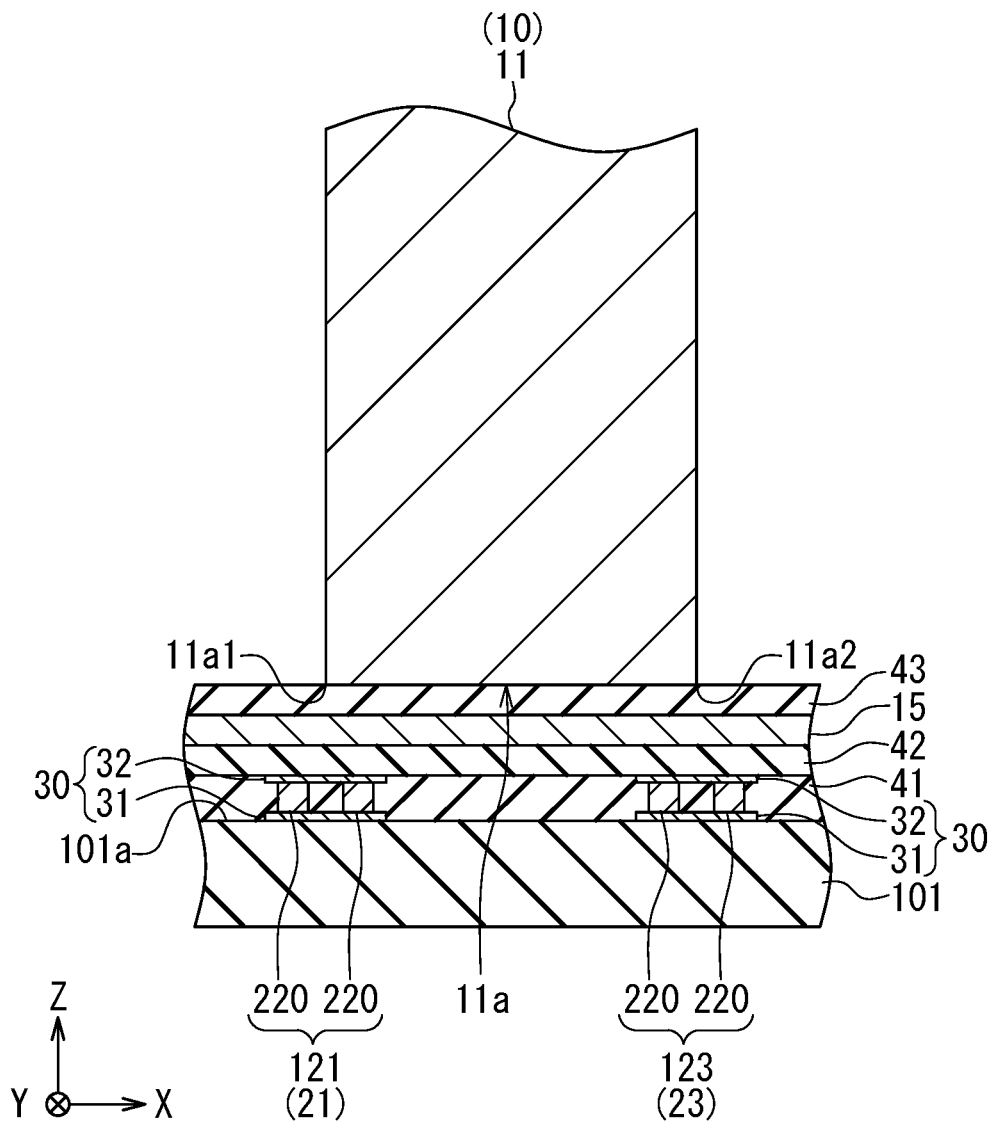
FIG. 15 is a cross-sectional view showing a cross section of part of a magnetic sensor according to a second embodiment of the invention, the cross section being perpendicular to the Y direction.

A second embodiment of the present invention will now be described. First, reference is made to FIG. 15 to describe the configuration of the magnetic sensor according to the second embodiment. FIG. 15 is a cross-sectional view showing a cross section of part of the magnetic sensor according to the second embodiment, the cross section being perpendicular to the Y direction. The magnetic sensor 1 according to the second embodiment differs from the first embodiment in the following ways. In the second embodiment, the magnetic film 15 is not in contact with the first ends 11a of the yokes 11.

Further, the magnetic sensor 1 according to the present embodiment includes a nonmagnetic film 43 formed of a nonmagnetic material and separating at least one yoke from the magnetic film 15. In the present embodiment, the nonmagnetic film 43 lies on the magnetic film 15. The yokes 11 are provided on the nonmagnetic film 43. The nonmagnetic film 43 may be formed of a nonmagnetic insulating material or a nonmagnetic metal material such as Ta, Ti, or W.

A manufacturing method for the magnetic sensor 1 according to the present embodiment will now be described briefly. The manufacturing method for the magnetic sensor 1 according to the present embodiment includes the step of forming the nonmagnetic film 43 between the step of forming the magnetic film 15 and the step of forming the magnetic field conversion unit 10. The manufacturing method in the present embodiment includes the same steps as those in the first embodiment up to the step of forming the magnetic film 15. In the next step of the present embodiment, the nonmagnetic film 43 is formed on the magnetic film 15. On the nonmagnetic film 43, an electrode film (not illustrated) of a magnetic material is formed. Then, using the electrode film as a seed and an electrode, a plurality of yoke bodies are formed by, for example, frame plating. Then, unwanted portions of the electrode film not covered by the yoke bodies are removed by etching. This completes a plurality of yokes 11. The yokes 11 are composed of the yoke bodies and the etched electrode film.

In the present embodiment, the nonmagnetic film 43 is interposed between the magnetic film 15 and the yokes 11. By virtue of this, the present embodiment prevents the top surface of the magnetic film 15 from being damaged during etching of the electrode film.

If the nonmagnetic film 43 is formed of a nonmagnetic metal material, the aforementioned electrode film may be omitted and the nonmagnetic film 43 may be used as a seed and an electrode in forming the yokes 11.

The other configuration, function and effects of the present embodiment are the same as those of the first embodiment.

Third Embodiment

Figure 16:
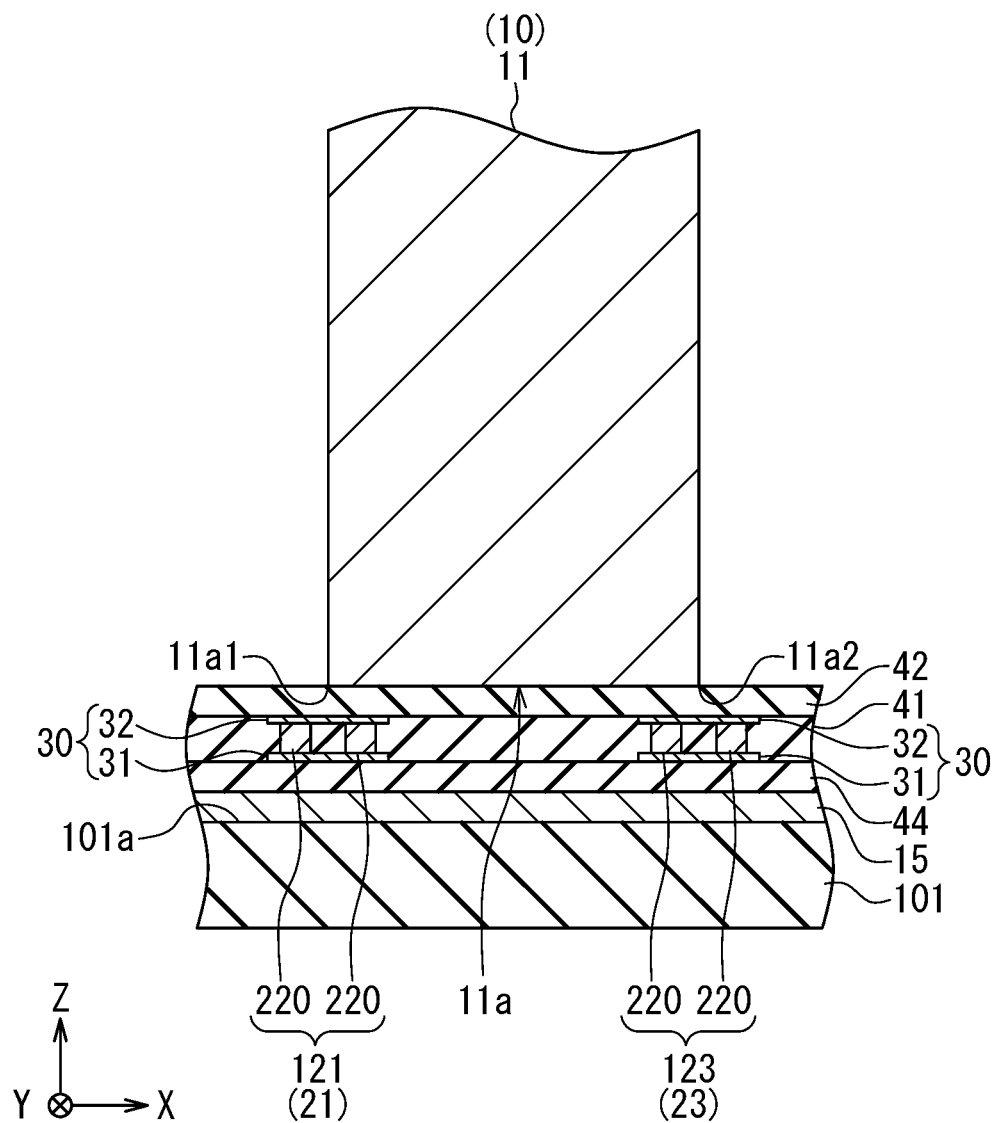
FIG. 16 is a cross-sectional view showing a cross section of part of a magnetic sensor according to a third embodiment of the invention, the cross section being perpendicular to the Y direction.

A third embodiment of the present invention will now be described. First, reference is made to FIG. 16 to describe the configuration of the magnetic sensor according to the third embodiment. FIG. 16 is a cross-sectional view showing a cross section of part of the magnetic sensor according to the third embodiment, the cross section being perpendicular to the Y direction. The magnetic sensor 1 according to the third embodiment differs from the first embodiment in the following ways. In the third embodiment, the magnetic film 15 is interposed between the substrate 101 and the first to fourth resistor sections 21 to 24 and the wiring section 30.

Further, the magnetic sensor 1 according to the present embodiment includes a nonmagnetic film 44 formed of a nonmagnetic insulating material. The magnetic film 15 lies on the top surface 101a of the substrate 101. The nonmagnetic film 44 is disposed to cover the magnetic film 15. The first to fourth resistor sections 21 to 24, the wiring section 30 and the nonmagnetic film 41 are disposed on the nonmagnetic film 44. The yokes 11 are disposed on the nonmagnetic film 42.

Figure 17:
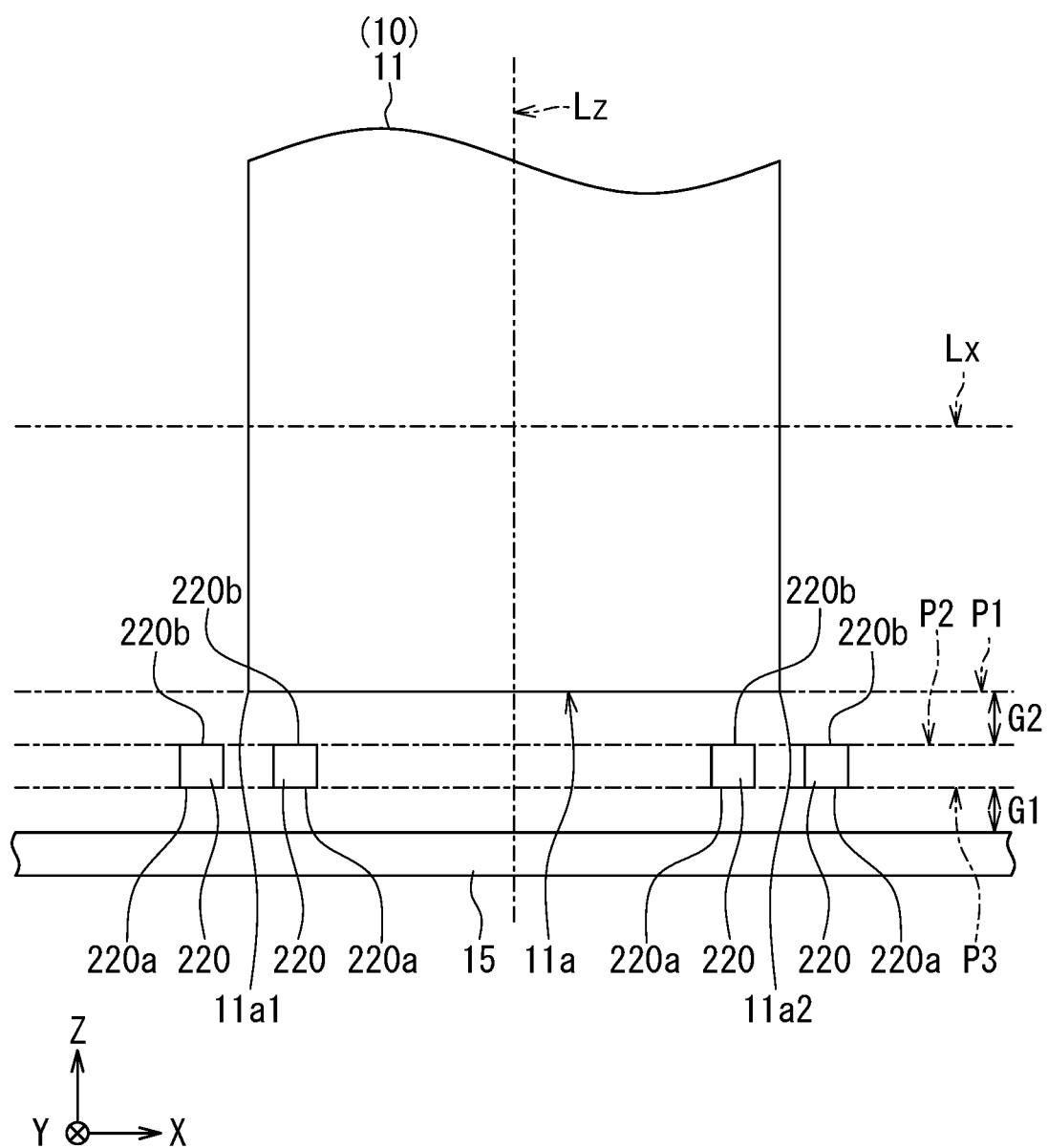
FIG. 17 is an explanatory diagram for explaining the positional relationship between a yoke, a magnetic film and magnetic detection elements in the third embodiment of the invention.

Reference is now made to FIG. 17 to describe the positional relationship between a yoke 11, the magnetic film 15 and the magnetic detection elements 220. FIG. 17 is an explanatory diagram for explaining the positional relationship between the yoke 11, the magnetic film 15 and the magnetic detection elements 220. Here, as shown in FIG. 17, assume that there is a third virtual plane P3 that includes the third ends 220a of the magnetic detection elements 220 and is parallel to the first virtual plane P1. In the present embodiment, the third virtual plane P3 is orthogonal to the first virtual straight line Lz. The magnetic film 15 is located on a side of the third virtual plane P3 opposite from the first virtual plane P1.

Here, as shown in FIG. 17, the distance between the magnetic film 15 and the third virtual plane P3 will be denoted by the reference sign G1, and the distance between the first virtual plane P1 and the second virtual plane P2 will be denoted by the reference sign G2. The distance G1 is preferably smaller than or equal to the distance G2. By satisfying such a condition, the magnetic film 15 is located such that the distance between the magnetic film 15 and the magnetic detection elements 220 is equal to the distance between the yoke 11 and the magnetic detection elements 220, or located closer to the magnetic detection elements 220 than is the yoke 11. This enables more effective absorption of part of noise magnetic flux by the magnetic film 15.

Next, a manufacturing method for the magnetic sensor 1 according to the present embodiment will be described briefly. In the present embodiment, the step of forming the magnetic film 15 is performed before the step of forming the magnetic field detection unit 20 and the wiring section 30. In the present embodiment, first, the magnetic film 15 is formed on the substrate 101. Then, the nonmagnetic film 44 is formed on the magnetic film 15. The first to fourth resistor sections 21 to 24, the wiring section 30 and the nonmagnetic films 41 and 42 are then formed on the nonmagnetic film 44. The yokes 11 are then formed on the nonmagnetic film 42. This completes the magnetic sensor 1.

The other configuration, function and effects of the present embodiment are the same as those of the first embodiment.

Fourth Embodiment

Figure 18:
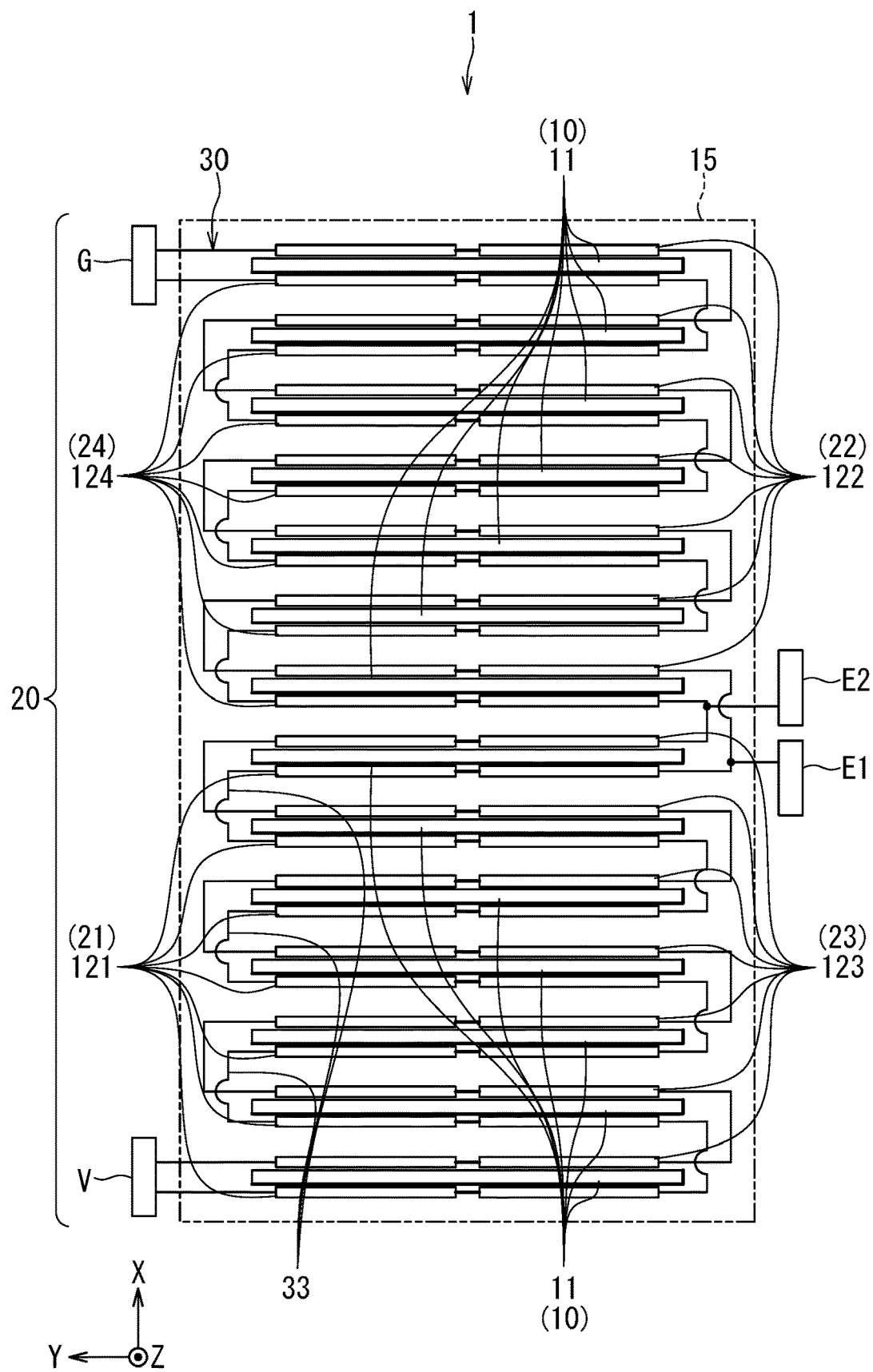
FIG. 18 is an explanatory diagram schematically illustrating the configuration of a magnetic sensor according to a fourth embodiment of the invention.
Figure 19:
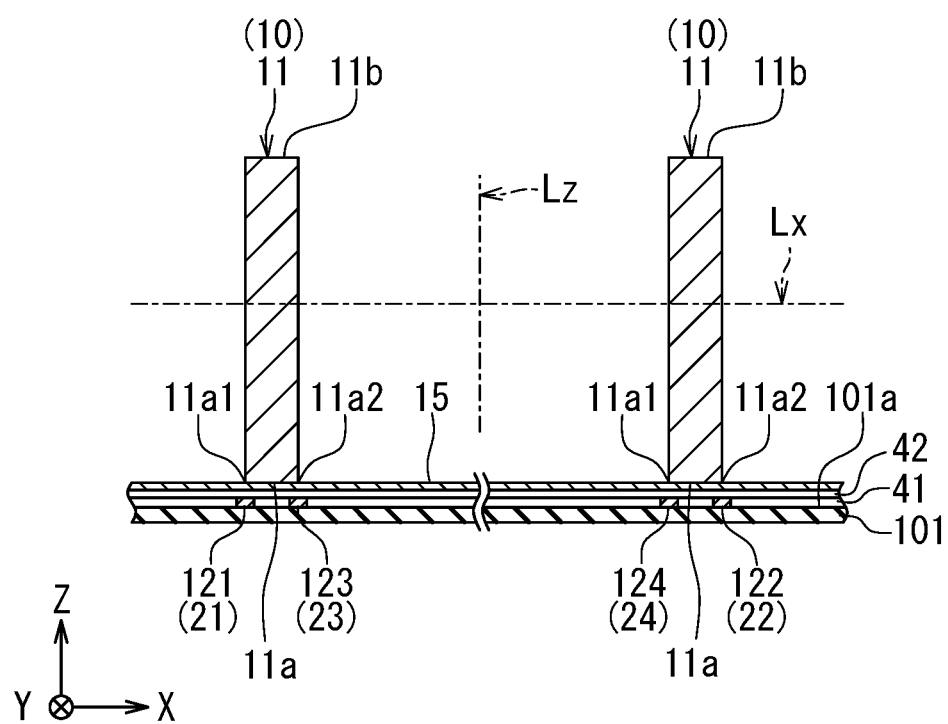
FIG. 19 is a cross-sectional view showing a cross section of part of the magnetic sensor according to the fourth embodiment of the invention, the cross section being perpendicular to the Y direction.

A fourth embodiment of the present invention will now be described. First, reference is made to FIG. 18 and FIG. 19 to describe the configuration of the magnetic sensor according to the fourth embodiment. FIG. 18 is an explanatory diagram schematically illustrating the configuration of the magnetic sensor according to the fourth embodiment. FIG. 19 is a cross-sectional view showing a cross section of part of the magnetic sensor according to the fourth embodiment, the cross section being perpendicular to the Y direction.

The magnetic sensor 1 according to the present embodiment differs from the first embodiment in the following ways. In the present embodiment, the yokes 11, the magnetic detection element trains 122 in the second resistor section 22, and the magnetic detection element trains 124 in the fourth resistor section 24 are arranged in a positional relationship different from that in the first embodiment. In the present embodiment, the magnetic detection element trains 122 and 124 are alternately arranged in the order of the magnetic detection element train 124 and the magnetic detection element train 122 along the X direction. As shown in FIG. 18, two or more yokes 11 among all the yokes 11 are each arranged to intersect a YZ plane that passes between one magnetic detection element train 124 and one magnetic detection element train 122 that is adjacent to the X-direction side of the magnetic detection element train 124. The remaining two or more yokes 11 among all the yokes 11 are each arranged to intersect a YZ plane that passes between one magnetic detection element train 121 and one magnetic detection element train 123 that is adjacent to the X-direction side of the magnetic detection element train 121.

As has been described in relation to the first embodiment, the first end 11a of each yoke 11 has the first edge 11a1 and the second edge 11a2. In the present embodiment, as shown in FIG. 19, the magnetic detection element train 122 is located near the second edge 11a2. The magnetic detection element train 124 is located near the first edge 11a1.

In the present embodiment, the direction of the output magnetic field components received by the magnetoresistive elements 220 in the fourth resistor section 24 is the same as the direction of the output magnetic field components received by the magnetoresistive elements 220 in the first resistor section 21. On the other hand, the direction of the output magnetic field components received by the magnetoresistive elements 220 in the second resistor section 22 and the direction of the output magnetic field components received by the magnetoresistive elements 220 in the third resistor section 23 are opposite to the direction of the output magnetic field components received by the magnetoresistive elements 220 in the first resistor section 21.

In the present embodiment, the magnetization pinned layers 222 of the magnetoresistive elements 220 in the second resistor section 22 and the magnetization pinned layers 222 of the magnetoresistive elements 220 in the fourth resistor section 24 are magnetized in the same direction as the magnetization pinned layers 222 of the magnetoresistive elements 220 in the first resistor section 21, that is, in the −X direction.

Now, a description will be given of the resistance values of the first to fourth resistor sections 21 to 24. As has been described in relation to the first embodiment, when no output magnetic field component is present, the magnetization direction of the free layer 224 of each magnetoresistive element 220 is parallel to the third virtual straight line Ly. In the present embodiment, when the input magnetic field component is in the Z direction, the output magnetic field components received by the magnetoresistive elements 220 in the first and fourth resistor sections 21 and 24 are in the X direction, whereas the output magnetic field components received by the magnetoresistive elements 220 in the second and third resistor sections 22 and 23 are in the −X direction. In this case, the magnetization direction of the free layer 224 of each magnetoresistive element 220 in the first and fourth resistor sections 21 and 24 is inclined from the direction parallel to the third virtual straight line Ly toward the X direction. As a result, relative to the case where no output magnetic field component is present, the magnetoresistive elements 220 in the first and fourth resistor sections 21 and 24 increase in resistance value, and the first and fourth resistor sections 21 and 24 also increase in resistance value. On the other hand, the magnetization direction of the free layer 224 of each magnetoresistive element 220 in the second and third resistor sections 22 and 23 is inclined from the direction parallel to the third virtual straight line Ly toward the −X direction. As a result, relative to the case where no output magnetic field component is present, the magnetoresistive elements 220 in the second and third resistor sections 22 and 23 decrease in resistance value, and the second and third resistor sections 22 and 23 also decrease in resistance value.

When the input magnetic field component is in the −Z direction, the direction of the output magnetic field components and the changes in the resistance values of the first to fourth resistor sections 21 to 24 are opposite to those in the aforementioned case in which the input magnetic field component is in the Z direction.

The positional relationship between the yoke 11, the magnetic film 15 and the magnetic detection elements 220 in the present embodiment may be the same as that in any of the first to third embodiments. The other configuration, function and effects of the present embodiment are the same as those of any of the first to third embodiments.

The present invention is not limited to the foregoing embodiments, and various modifications may be made thereto. For example, as far as the requirements of the appended claims are met, the numbers, shapes and locations of the yokes 11, the magnetic film 15 and the magnetic detection elements 220 are not limited to the respective examples illustrated in the foregoing embodiments, but can be freely chosen. For example, the magnetic detection elements 220 may be circular in planar shape. In such a case, the magnetic field detection unit 20 may include a plurality of magnets for applying, to the magnetic detection elements 220, a bias magnetic field in a direction parallel to the third virtual straight line Ly.

Further, the magnetic field conversion unit 10 may include a plurality of yokes located below the lower electrodes 31, in addition to the yokes 11 located above the upper electrodes 32. The yokes below the lower electrodes 31 are disposed to be offset from the yokes 11 above the upper electrodes 32 in the direction parallel to the second virtual straight line Lx so as to increase the conversion efficiency.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising: a magnetic field conversion unit; a magnetic field detection unit; and a magnetic film formed of a soft magnetic material, wherein
the magnetic field conversion unit includes a plurality of yokes formed of a soft magnetic material,
each of the plurality of yokes is configured to receive an input magnetic field and generate an output magnetic field, the input magnetic field containing an input magnetic field component in a direction parallel to a first virtual straight line, the output magnetic field contains an output magnetic field component in a direction parallel to a second virtual straight line intersecting the first virtual straight line, the output magnetic field component varying depending on the input magnetic field component, the plurality of yokes are aligned spaced from each other in the direction parallel to the second virtual straight line, the magnetic field detection unit includes at least one magnetic detection element, the at least one magnetic detection element is configured to receive the output magnetic field and generate a detection value corresponding to the output magnetic field component, each of the plurality of yokes has a first end and a second end opposite to each other in the direction parallel to the first virtual straight line, the first end is located closer to the at least one magnetic detection element than is the second end, the at least one magnetic detection element has a third end and a fourth end opposite to each other in the direction parallel to the first virtual straight the fourth end is located closer to the plurality of yokes than is the third end, assuming that there are a first virtual plane including the first end, intersecting the first virtual straight line and being parallel to the second virtual straight line, and a second virtual plane including the fourth end and being parallel to the first virtual plane, the magnetic film is located within a spatial range extending from the first virtual plane to the second virtual plane, each of the plurality of yokes has a width, the width being a dimension in the direction parallel to the second virtual straight line, the magnetic film has a thickness and a width, the thickness being a dimension in the direction parallel to the first virtual straight line, the width being a dimension in the direction parallel to the second virtual straight line, the thickness of the magnetic film is smaller than the width of each of the plurality of yokes, and the width of the magnetic film is greater than the width of each of the plurality of yokes, and is greater than a distance between two yokes of the plurality of yokes located at opposite ends in the direction parallel to the second virtual straight line.

2. The magnetic sensor according to claim 1, wherein the magnetic film is in contact with the first end of each of the plurality of yokes.

3. The magnetic sensor according to claim 1, further comprising a nonmagnetic film formed of a nonmagnetic material and separating the plurality of yokes from the magnetic film.

4. The magnetic sensor according to claim 1, wherein the second virtual straight line and the first virtual plane are orthogonal to the first virtual straight line.

5. The magnetic sensor according to claim 1, wherein the thickness of the magnetic film is smaller than or equal to one-half the width of each of the plurality of yokes.

6. A magnetic sensor comprising: a magnetic field conversion unit; a magnetic field detection unit; and a magnetic film formed of a soft magnetic material, wherein the magnetic field conversion unit includes at least one yoke formed of a soft magnetic material, the at least one yoke is configured to receive an input magnetic field and generate an output magnetic field, the input magnetic field containing an input magnetic field component in a direction parallel to a first virtual straight line, the output magnetic field contains an output magnetic field component in a direction parallel to a second virtual straight line intersecting the first virtual straight line, the output magnetic field component varying depending on the input magnetic field component, the magnetic field detection unit includes at least one magnetic detection element, the at least one magnetic detection element is configured to receive the output magnetic field and generate a detection value corresponding to the output magnetic field component, the at least one yoke has a first end and a second end opposite to each other in the direction parallel to the first virtual straight line, the first end is located closer to the at least one magnetic detection element than is the second end, the at least one magnetic detection element has a third end and a fourth end opposite to each other in the direction parallel to the first virtual straight line, the fourth end is located closer to the at least one yoke than is the third end, assuming that there are a first virtual plane including the first end, intersecting the first virtual straight line and being parallel to the second virtual straight line, a second virtual plane including the fourth end and being parallel to the first virtual plane, and a third virtual plane including the third end and being parallel to the first virtual plane, the magnetic film is located on a side of the third virtual plane such that the at least one magnetic detection element is located between the magnetic film and the at least one yoke along the direction parallel to the first virtual straight line, the at least one yoke has a width, the width being a dimension in the direction parallel to the second virtual straight line, the magnetic film has a thickness and a width, the thickness being a dimension in the direction parallel to the first virtual straight line, the width being a dimension in the direction parallel to the second virtual straight line, the thickness of the magnetic film is smaller than the width of the at least one yoke, and the width of the magnetic film is greater than the width of the at least one yoke.

7. The magnetic sensor according to claim 6, wherein a distance between the magnetic film and the third virtual plane is smaller than or equal to a distance between the first virtual plane and the second virtual plane.

8. The magnetic sensor according to claim 6, wherein the second virtual straight line and the first virtual plane are orthogonal to the first virtual straight line.

9. The magnetic sensor according to claim 6, wherein the thickness of the magnetic film is smaller than or equal to one-half the width of the at least one yoke.

10. A magnetic sensor comprising: a magnetic field conversion unit; a magnetic field detection unit; and a magnetic film formed of a soft magnetic material, wherein the magnetic field conversion unit includes a plurality of yokes formed of a soft magnetic material, the magnetic field detection unit includes at least one magnetic detection element, each of the plurality of yokes has a first end and a second end opposite to each other in the direction parallel to a first virtual straight line, the first end is located closer to the at least one magnetic detection element than is the second end, the at least one magnetic detection element has a third end and a fourth end opposite to each other in the direction parallel to the first virtual straight line, the fourth end is located closer to the plurality of yokes than is the third end, the plurality of yokes are aligned spaced from each other in a direction parallel to a second virtual straight line intersecting the first virtual straight line, assuming that there are a first virtual plane including the first end, intersecting the first virtual straight line and being parallel to the second virtual straight line, and a second virtual plane including the fourth end and being parallel to the first virtual plane, the magnetic film is located within a spatial range extending from the first virtual plane to the second virtual plane, each of the plurality of yokes has a width, the width being a dimension in the direction parallel to the second virtual straight line, the magnetic film has a thickness and a width, the thickness being a dimension in the direction parallel to the first virtual straight line, the width being a dimension in the direction parallel to the second virtual straight line, the thickness of the magnetic film is smaller than the width of each of the plurality of yokes, the width of the magnetic film is greater than the width of each of the plurality of yokes, and is greater than a distance between two yokes of the plurality of yokes located at opposite ends in the direction parallel to the second virtual straight line, each of the plurality of yokes is configured to generate an output magnetic field containing an output magnetic field component in a direction parallel to the second virtual straight line, and the at least one magnetic detection element is configured to receive the output magnetic field and generate a detection value corresponding to the output magnetic field component.

11. A magnetic sensor comprising: a magnetic field conversion unit; a magnetic field detection unit; and a magnetic film formed of a soft magnetic material, wherein the magnetic field conversion unit includes at least one yoke formed of a soft magnetic material, the magnetic field detection unit includes at least one magnetic detection element, the at least one yoke has a first end and a second end opposite to each other in the direction parallel to a first virtual straight line, the first end is located closer to the at least one magnetic detection element than is the second end, the at least one magnetic detection element has a third end and a fourth end opposite to each other in the direction parallel to the first virtual straight line, the fourth end is located closer to the at least one yoke than is the third end, assuming that there are a second virtual straight line intersecting the first virtual straight line, a first virtual plane including the first end, intersecting the first virtual straight line and being parallel to the second virtual straight line, a second virtual plane including the fourth end and being parallel to the first virtual plane, and a third virtual plane including the third end and being parallel to the first virtual plane, the magnetic film is located on a side of the third virtual plane such that the at least one magnetic detection element is located between the magnetic film and the at least one yoke along the direction parallel to the first virtual straight line, the at least one yoke has a width, the width being a dimension in the direction parallel to the second virtual straight line, the magnetic film has a thickness and a width, the thickness being a dimension in the direction parallel to the first virtual straight line, the width being a dimension in the direction parallel to the second virtual straight line, the thickness of the magnetic film is smaller than the width of the at least one yoke, the width of the magnetic film is greater than the width of the at least one yoke, the at least one yoke is configured to generate an output magnetic field containing an output magnetic field component in a direction parallel to the second virtual straight line, and the at least one magnetic detection element is configured to receive the output magnetic field and generate a detection value corresponding to the output magnetic field component.

* * * * *